(12) United States Patent
Uchiki et al.

(10) Patent No.: US 6,473,472 B2
(45) Date of Patent: Oct. 29, 2002

(54) ADAPTIVE ARRAY COMMUNICATION SYSTEM AND RECEIVER

(75) Inventors: Tatsuya Uchiki, Tokyo (JP); Toshiharu Kojima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/879,032

(22) Filed: Jun. 13, 2001

(65) Prior Publication Data

US 2001/0046270 A1 Nov. 29, 2001

Related U.S. Application Data

(63) Continuation of application No. PCT/JP00/04890, filed on Jul. 21, 2000.

(30) Foreign Application Priority Data

Nov. 10, 1999 (JP) ............................................ 11-320307

(51) Int. Cl.[7] .......................... H03M 13/12; H04B 1/00; H04B 7/00
(52) U.S. Cl. ........................ 375/341; 375/262; 375/346; 714/795
(58) Field of Search ................................. 375/262, 265, 375/340, 341, 346, 348; 714/794, 795

(56) References Cited

U.S. PATENT DOCUMENTS 5,146,475 A    9/1992    Kubo

FOREIGN PATENT DOCUMENTS

| JP | 03-73623   | 3/1991  |
| JP | 06-216885  | 8/1994  |
| JP | 09-036638  | 2/1997  |
| JP | 09-260941  | 10/1997 |
| JP | 10-013262  | 1/1998  |
| JP | 11-225100  | 8/1999  |

OTHER PUBLICATIONS

An Adaptive Maximum–Likelihood Sequence Estimator For Fast Time–Varying Intersymbol Interference Channels IEEE Trans. Commun., vol. 42, pp. 1872–1880, H. Kubo et al. Feb.–Apr. 1994.

Per–Survivor Processing: A General Approach to MLSE In Uncertain Environments IEEE Trans, Commun., vol. 43, pp. 354–364 Feb.–Apr., 1995.

Adaptive Array For Mobile Radio [III], –Applications To Interference Canceling And Fading Countermeasure–Journal Of The Institute Of Electronics, Information and Communication Engineers, vol. 82 No. 2, Takeo Ohgane and Yasutake Ogawa Feb. 1999.

Adaptive Array For Mobile Radio [IV–Conclusion], –Applications To Interference Canceling And Fading Countermeasure–Journal Of The Institute Of Electronics, Information and Communication Engineers, vol. 82 No. 3, Takeo Ohgane and Yasutake Ogawa Mar. 1999.

(List continued on next page.)

Primary Examiner—Young T. Tse
(74) Attorney, Agent, or Firm—Oblon, Spivak, McClelland, Maier & Neustadt, P.C.

(57) ABSTRACT

An adaptive array communication system includes an adaptive control unit (31) which performs a weighting process by multiplying received signals from a plurality of antennas by complex weights which are different from each other for respective states to combine the received signals, a decoding unit (34) which calculates a metric corresponding to a transition to a desired state, and an error vector calculation circuit (33) which calculates an error vector for calculating complex weights which are different from each other for the respective states.

10 Claims, 20 Drawing Sheets

OTHER PUBLICATIONS

Introduction To Applicable Filters S. Haykin, Translated By Tsuyoshi Takebe, Publisher: Gendai Kogaku sha First Edition Sep. 10, 1987.

Phase Tracking Viterbi Demodulator Journal Of The Institute of Electronics, Information and Communication Engineers, B–II, vol. J77–B–II No. 12 pp. 767–779 Mutsumi Serizawa, Shigeru Asakawa and Junzo Murakami Dec. 1994.

FIG.4
(a)
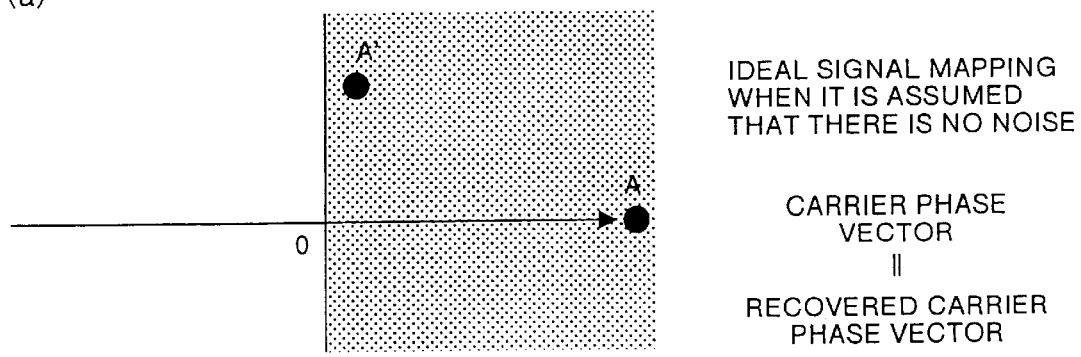
IDEAL SIGNAL MAPPING
WHEN IT IS ASSUMED
THAT THERE IS NO NOISE
CARRIER PHASE
VECTOR
∥
RECOVERED CARRIER
PHASE VECTOR
(b)
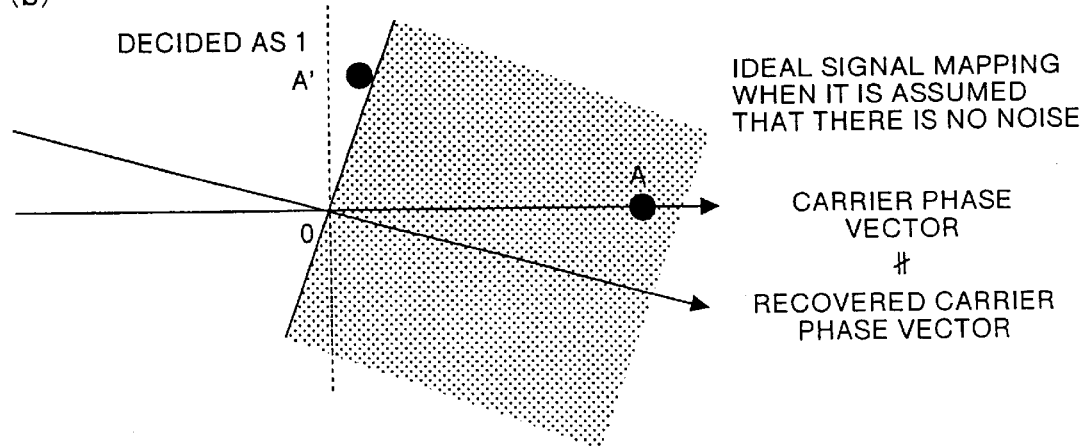
IDEAL SIGNAL MAPPING
WHEN IT IS ASSUMED
THAT THERE IS NO NOISE
CARRIER PHASE
VECTOR
≠
RECOVERED CARRIER
PHASE VECTOR

FIG.14
(a)
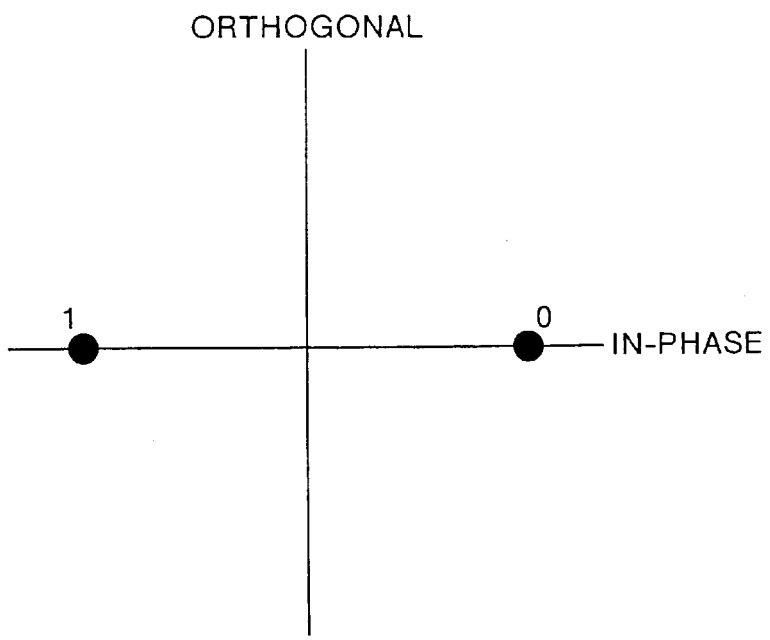
(b)
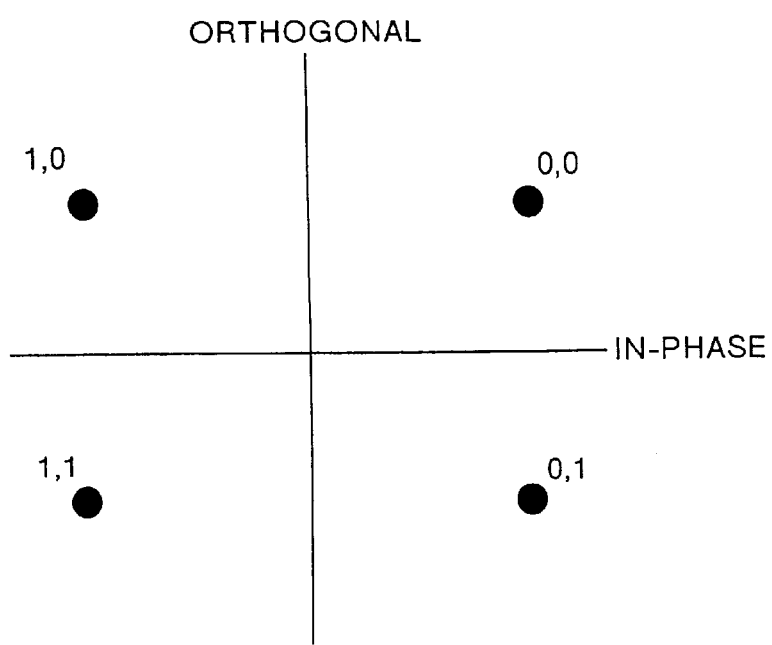

ADAPTIVE ARRAY COMMUNICATION SYSTEM AND RECEIVER

TECHNICAL FIELD

The present invention in general relates to an adaptive array communication system that removes an unnecessary signal by using an adaptive array technique. More particularly, this invention relates to an adaptive array communication system and a receiver capable of realizing an improvement in demodulation characteristic by efficiently removing interference in a fading environment of a land mobile communication or the like.

BACKGROUND ART

A conventional receiver will be described below. For example, a conventional receiver using an adaptive array antenna technique which is one of techniques for improving bit error rate performance in a receiver will be described below.

As a technique related to a conventional receiver, for example, "Adaptive Array for Mobile Radio" (Ohgane, Ogawa, November, 1998 to March, 1999) described in Journal of The Institute of Electronics, Information and Communication Engineers is known. The adaptive algorithm itself is described in a reference "Introduction to Adaptive Filters" (S. Haykin, translated by Tsuyoshi TAKEBE, Gendai Kogaku sha, Third Edition, on Mar. 10, 1994).

For example, in land mobile communication such as a portable telephone system, a base station is installed corresponding to each one of a plurality of areas. These areas are generally called as cells. Mobile stations existing in a cell communicate with the base station of that cell. In this case, for a mobile station in the cell, a radio wave from the base station in the same cell is a desired wave. Similarly, for the base station in the cell, a radio wave from the mobile station in the same cell is a desired wave. However, a mobile station existing near a boundary of another cell receives interference from a mobile station existing in another cell using the same frequency and a base station of another cell which communicates with the mobile station. Since the transmission power of a base station is generally higher than the transmission power of a mobile station, the base stations receive the interference the most.

In such a case, in an adaptive array communication system, a plurality of antennas (array) are used, and the directivity of the array is adaptively controlled, so that the process of removing an interference wave except for a desired wave and the process of combining a plurality of desired waves reflected from buildings or the like and having different arrival times are performed. More specifically, a directivity (beam) is turned in a desired wave direction, and a point where the beam is 0 (null) is turned in an interference direction to remove an interference wave. A plurality of beams are turned toward a plurality of desired waves to equalize delays and to combine desired waves, so that a preferable characteristic is realized.

FIG. 15 is a diagram showing the configuration of a conventional receiver. In FIG. 15, as one example of the conventional receiver, an adaptive array communication system using mean square error (MSE) criteria is shown. In this receiver, received signals from a plurality of antennas (branches) are weighted by coefficients (complex weights) which are different from each other for the respective branches, and a signal is combined. At this time, in the adaptive array communication system, on the basis of the received signals from the branches and the combined signal (array output), a such optimum complex weight that a desired wave is increased and an unnecessary wave is decreased in the array output is determined.

The details of the operation of the conventional receiver will be described below. In the adaptive array communication system of N branches (N: a natural number of 2 or more) using the MSE criteria shown in FIG. 15, an optimum complex weight $w_j$ is determined by using a known reference signal $d_i$ included in the received signals. First, inputs $X_{j,i}$ (j is a branch number: j=1 to N and i is an integer representing a symbol timing) of branches are multiplied by the complex weights $w_j$ output from an adaptive control unit 181 in a multiplier. Signals multiplied by the complex weights $w_j$ are input into an adder 182 and added (combined) to each other to calculate an array output $y_i$. More specifically, $$y_i = \sum_{j=1}^{N} w_j x_{j,i} \quad (1)$$

is satisfied.

Thereafter, the array output $y_i$ is input into a demodulation unit (not shown) and input into an adder 183 to be compared with the known reference signal $d_i$. As a result, an error signal $\epsilon_i$ is output from the adder 183. More specifically, $$\epsilon_i = d_i - Y_i \quad (2)$$

is satisfied.

The error signal $\epsilon_i$ output from the adder 183 is, thereafter, input into the adaptive control unit 181. In the adaptive control unit 181, by using the error signal $\epsilon_i$, the complex weight $w_j$ is controlled on the basis of an adaptive algorithm. For example, when an LMS (Least Mean Square) as the adaptive algorithm, the complex weight is changed (controlled) by the following equation:

$$w_{j,i+1} = w_{j,i} + 2\mu x_{j,i}^* \epsilon_i \quad (3)$$

Note that $w_{j,i}$ represents the complex weight $w_j$ including a symbol timing. In the following, * represents a complex conjugate.

According to Equations (1), (2), and (3), the complex weight $w_j$ is controlled to such an optimum value that a desired wave is maximum and an interference wave is minimum in the array output $y_i$. In this manner, since the signal controlled to the optimum value is demodulated, the adaptive array communication system can improve bit error rate performance in the array output $y_i$. Therefore, for example, when the adaptive array communication system shown in FIG. 15 is applied to a system using convolutional coding/viterbi decoding as shown in FIG. 16, the bit error rate performance in the array output $y_i$ is improved. For this reason, bit error rate performance in a decoded output of a viterbi decoder can be improved.

In addition, as a conventional receiver different from the above receiver, for example, an adaptive array communication system using a decision feedback loop is known. FIG. 17 is a diagram showing the configuration of a conventional receiver using a decision feedback loop. In this case, the complex weight $w_j$ is updated by an adaptive algorithm using data except for the known reference signal $d_i$. The same reference numerals as in the configuration in FIG. 15 denote the same parts in the configuration in FIG. 17, and a description thereof will be omitted. In this receiver, for example, a method of deciding an array output $y_i$ by a decision unit 191 and selecting an output $d_i'$ from the decision unit 191 as a reference signal by a selection unit 192 to calculate an error signal $\epsilon_i'$ is used. More specifically, when an LMS algorithm is applied, by the following equation:

$$W_{j,i+1} = W_{j,i} + 2\mu x_{j,i} * \epsilon_i' \quad \epsilon_i' = d_i' - y_i \quad (4)$$

the complex weight $w_j$ is calculated. In this manner, since a signal controlled to an optimum value, the adaptive array communication system can improve a bit error rate performance in an array output $y_i$. In addition, an error signal $\epsilon_i'$ can be calculated even in a period having no reference signal $d_i$, and the LMS algorithm can be operated at a high accuracy.

Therefore, for example, when an adaptive array communication system using the decision feedback loop shown in FIG. 17 is applied to a system using convolutional coding/viterbi decoding as shown in FIG. 18, as shown in FIG. 18, re-encoded data of viterbi decoder output is assumed as a reference signal $d_i'$. The data is fedback to the adaptive array, so that the error signal $\epsilon_i'$ can be calculated. As a result, bit error rate performance in a decoded output of a viterbi decoder can be further improved.

However, in the conventional receiver as shown in FIG. 15, since calculation represented by Equation (3) is repeated until the complex weight $w_j$ converges to an optimum value by the adaptive algorithm, the error signal $\epsilon_i$ is required. In the example using the LMS algorithm described above, when the error signal $\epsilon_i$ is to be calculated, the known reference signal $d_i$ described in Equation (2) is required. For this reason, when the reference signal $d_i$ is ended before the complex weight $w_j$ is converged to an optimum value, that is, when the sequence length of the reference signal $d_i$ is not sufficient, a correct error signal cannot be calculated. There is a problem that the complex weight $w_j$ is not converged to the optimum value and a problem that the bit error rate performance is degraded.

This problem will be described in more detail below with reference to the drawings. FIG. 19 is a graph showing a change in complex weight with time. For example, in an LMS algorithm, when the complex weight $w_j$ is controlled to an optimum value $w_{opt}$ on the basis of an error signal $\epsilon_i$ between the reference signal $d_i$ and the array output $y_i$, as shown in FIG. 19, the complex weight $w_j$ becomes sequentially close to the optimum value $w_{opt}$ by the LMS algorithm. For this reason, when the reference signal $d_i$ exists for a sufficiently long time, for example, until time t shown in FIG. 19, the complex weight is almost equal to the optimum value $w_{opt}$. For this reason, a preferable characteristic can be realized. However, when the reference signal $d_i$ exists for a short time, for example, when the reference signal $d_i$ is ended until time $t_0$, the complex weight $w_j$ is largely different from the optimum value, the characteristic is degraded.

On the other hand, when the sufficiently long reference signal $d_i$ is used, the LMS algorithm is converged, and an optimum complex weight $w_{opt}$ can be calculated. However, insertion of the long reference signal disadvantageously causes transmission efficiency to be degraded.

When the LMS algorithm is converged by the short reference signal $d_i$ to calculate an optimum complex weight, the variation of the optimum complex weight $w_{opt}$ with time cannot be neglected. More specifically, when the complex weight $w_{opt}$ varies with time in one burst period, a stable demodulation characteristic is not obtained, the characteristic is degraded. This phenomenon is generated such that an interference station or a self station moves or the reception power of a desired wave or an interference wave varies due to fading.

This problem will be described below by using the drawings. FIG. 20 is a graph showing a change of the complex weight $w_j$ with time. For example, if the optimum complex weight $w_{opt}$ is a constant value in one burst period, the complex weight $w_j$ obtained by the LMS algorithm is sequentially controlled to the optimum value $w_{opt}$ as indicated by a curve A. However, when a mobile station and an inerference station move or when a reception power varies due to fading, and when the optimum value $w_{opt}$ varies in one burst period as indicated by a curve B, the complex weight $w_j$ obtained by the LMS algorithm varies as indicated by a curve C, for example. In this case, since the reference signal $d_i$ ends at time t, the complex weight $w_j$ can be controlled until time t as shown in FIG. 20. More specifically, after time t, the complex weight $w_j$ cannot be controlled, and the complex weight $w_j$ cannot be made close to the optimum value $w_{opt}$ indicated by a curve B. For this reason, bit error rate performance is degraded.

Therefore, for example, when the adaptive array communication system shown in FIG. 15 is applied to a system using convolutional coding/viterbi decoding as shown in FIG. 16, the same problems as described above are posed.

In order to solve the problems, when the conventional receiver as shown in FIG. 17 is used, a decision result $d_i'$ of an array output $y_i$ may be erroneous. For example, when the decision result $d_i'$ is erroneous, an error signal $\epsilon_i'$ obtained from the erroneous decision result is also erroneous. For this reason, a correct error signal can be obtained. Therefore, in an updating equation using the LMS algorithm expressed by Equation (4), the complex weight $w_j$ cannot be correctly controlled, and the characteristic is disadvantageously degraded.

For example, when an adaptive array communication system using the decision feedback loop shown in FIG. 17 is applied to the system using the convolutional coding/viterbi decoding as shown in FIG. 18, as shown in FIG. 18, re-encoded data of a viterbi decoder output is handled as a reference signal $d_i'$. The data is fed back to the adaptive array, so that the error signal $\epsilon_i'$ can be calculated. For this reason, the possibility of falling in a vicious circle where erroneous control is caused by an error of the decision result can be reduced, and the characteristic can be suppressed from being degraded. However, it is generally known that a process delay required for viterbi decoding is large. For this reason, in a method of controlling the complex weight $w_j$ on the basis of the re-encoded data $d_i'$ of the viterbi decoder output as shown in FIG. 18, as in the case in which the LMS algorithm is applied without applying the convolutional coding/viterbi decoding described above, when an optimum complex weight varies with time in one burst period, the characteristic is degraded.

As an adaptive algorithm which can be applied to an adaptive array communication system based on the MSE criteria except for the LMS algorithm described in the above background art, for example, an SMI (Sample Matrix Inverse) algorithm for solving a normal equation or an RLS (Recursive Least Squares) algorithm for recursively calculating an inverse matrix is known. However, the SMI algorithm has a problem that a circuit scale is considerably increased because an inverse matrix calculation is necessary. In addition, in the RLS algorithm, although no inverse matrix calculation is necessary, as in the LMS algorithm, an error signal must be calculated when a complex weight is controlled. In addition, since a complicated recursive equation is used, the RLS algorithm has a problem that the circuit scale is inevitably increased.

It is an object of the present invention to provide an adaptive array communication system and a receiver being capable of realizing calculation of an optimum complex weight independently of the sequence length of a reference signal and being capable of realizing a preferable demodulation characteristic even though a reception power varies due to the movement of a mobile station and an interference station or fading to cause a complex weight to vary with time.

DISCLOSURE OF THE INVENTION

The adaptive array communication system according to one aspect of this invention includes a transmitter (corresponding to a convolutional encoder 1 and a QPSK modulator 2 according to an embodiment (to be described later)) for modulating coded information data by a predetermined modulation method, and a receiver (corresponding to a demodulator 3) which performs known viterbi decoding to a received signal from the transmitter to select a most likely path. The receiver further includes adaptive control unit (corresponding to an adaptive control unit 31) which performs weight control on the basis of a known adaptive algorithm for each state of the viterbi decoding, multiplies received signals from a plurality of antennas by complex weights which are different from each other for the respective states to perform weighting processes depending on the received signals, and, thereafter, combines the weighted signals to perform such control that a desired wave component is maximized and an interference wave component is minimized; decoding unit (corresponding to a decoding unit 34) which adds a branch metric and a path metric calculated by a difference between a signal obtained after the weighting combining and a reference signal (corresponding to a replicate signal) serving as an ideal received signal to calculate a metric corresponding to a state transition; and error vector calculation unit (corresponding to an error vector calculation circuit 33) which calculates an error vector for calculating complex weights which are different from each other for the respective states on the basis of the signal obtained after the weighting combining and the reference signal, and the directivities of the plurality of antennas are adaptively controlled to perform a process of removing an interference wave except for a desired wave and a process of combining a plurality of desired waves.

According to the above-mentioned aspect, there is provided an adaptive control unit which performs weight control for supplying an optimum complex weight for each state to maximize a weighted/combined desired wave component and to minimize an interference wave component is arranged to perform adaptive array control for each state of viterbi decoding. Even though a complex weight varies with time in one burst period, the adaptive array communication system can easily track the complex weight.

In the adaptive array communication system according to the next aspect of this invention, the transmitter makes a coding rate in convolutional coding variable (corresponding to a convolutional coder 4).

According to the above-mentioned aspect, coding rate is increased to (n−1)/n by using a punctured code to improve transmission efficiency. In addition, the coding rate is set to be 1/n to improve error correction capability.

In the adaptive array communication system according to the next aspect, as a modulation method in the transmitter, a BPSK (corresponding to a BPSK modulator 6) or a QPSK (corresponding to a QPSK modulator 2) is used.

According to the above-mentioned aspect, by using the QPSK demodulation method, a preferable characteristic is obtained even in a severe environment. In addition, by using the BPSK modulation method, mapping is simplified.

The adaptive array communication system according to the next aspect includes a transmitter which modulates coded information data by a predetermined modulation method, and a receiver (corresponding to a demodulator 8) which performs known viterbi decoding to a received signal from the transmitter to select a most likely path. The receiver further includes an adaptive control unit which performs weight control on the basis of a known adaptive algorithm for each state of the viterbi decoding, multiplies received signals from a plurality of antennas by a complex weight shared by all the states to perform weighting processes depending on the received signals, and, thereafter, combines the weighted signals to perform such control that a desired wave component is maximized and an interference wave component is minimized; a decoding unit which adds a branch metric and a path metric calculated by a difference between a signal obtained after the weighting combining and a reference signal (replicate signal) serving as an ideal received signal to calculate a metric corresponding to a transition to a desired state; and an error vector calculation unit which calculates an error vector for calculating a complex weight which is shared by all the states on the basis of the signal obtained after the weighting combining and the reference signal, and further includes maximum-likely state decision unit (corresponding to a maximum-likely state decision circuit 52) which decides a complex weight in a maximum-likely state at a specific symbol timing as a complex weight shared by all states at the next symbol timing for each receiver, and the directivities of the plurality of antennas are adaptively controlled to perform a removing process of an interference wave except for a desired wave or a combining process of a plurality of desired waves.

According to the above-mentioned aspect, a complex weight in a maximum-likely state at a specific symbol timing is updated as a complex weight which is shared by all states at the next symbol timing.

In the adaptive array communication system according to the next aspect, LMS algorithm or RLS algorithm is used as the predetermined adaptive algorithm.

According to the above-mentioned aspect, for example, when the LMS algorithm is used as an adaptive algorithm, a calculation amount can be reduced. On the other hand, when the RLS algorithm is applied, although a calculation amount which is larger than that in the LMS algorithm is necessary, a converging rate of a complex weight can be increased.

The receiver according to the next aspect includes a configuration which performs known viterbi decoding to a signal from a transmitter which modulates coded information data by a predetermined modulation method, an adaptive control unit which performs weight control on the basis of a known adaptive algorithm for each state of viterbi decoding, multiplies received signals from a plurality of antennas by complex weights which are different from each other for the respective states to perform weighting processes depending on the received signals, and, thereafter, combines the weighted signals to perform such control that a desired wave component is maximized and an interference wave component is minimized; a decoding unit which adds a branch metric and a path metric calculated by a difference between a signal obtained after the weighting combining and a reference signal (replicate signal) serving as an ideal received signal to calculate a metric corresponding to a transition to a desired state; and an error vector calculation unit which calculates an error vector for calculating complex weights which are different from each other for the respective states on the basis of the signal obtained after the weighting combining and the reference signal.

According to the above-mentioned aspect, an adaptive control unit which performs weight control for supplying an optimum complex weight for each state to maximize a weighted/combined desired wave component and to minimize an interference wave component is arranged to perform adaptive array control for each state of viterbi decoding. Even though a complex weight varies with time in one burst period, the receiver can easily follow the complex weight.

The receiver according to the next aspect includes a configuration which performs known viterbi decoding to a signal from a transmitter which modulates coded information data by a predetermined modulation method, an adaptive control unit which performs weight control on the basis of a known adaptive algorithm for each state of viterbi decoding, multiplies received signals from a plurality of antennas by a complex weight shared by all the states to perform weighting processes depending on the received signals, and, thereafter, combines the weighted signals to perform such control that a desired wave component is maximized and an interference wave component is minimized; a decoding unit which adds a branch metric and a path metric calculated by a difference between a signal obtained after the weighting combining and a reference signal (replicate signal) serving as an ideal received signal to calculate a metric corresponding to a transition to a desired state; and an error vector calculation unit which calculates an error vector for calculating a complex weight which is shared by all the states on the basis of the signal obtained after the weighting combining and the reference signal, and further includes a maximum-likely state decision unit which decides a complex weight in a maximum-likely state at a specific symbol timing as a complex weight shared by all states at the next symbol timing.

According to the above-mentioned aspect, a complex weight in a maximum-likely state at a specific symbol timing is updated as a complex weight which is shared by all states at the next symbol timing.

In the adaptive array communication system according to the next aspect, LMS algorithm or RLS algorithm is used as the predetermined adaptive algorithm.

According to the above-mentioned aspect, for example, when the LMS algorithm is used as an adaptive algorithm, a calculation amount can be reduced. On the other hand, when the RLS algorithm is applied, although a calculation amount which is larger than that in the LMS algorithm is necessary, a convergent rate of a complex weight can be increased.

BRIEF DESCRIPTION OF THE DRAWINGS

FIG. 4 includes graphs showing decision of signal signs performed by a coherent detection circuit 101;

FIG. 14 includes graphs showing examples of signal mapping in digital modulations;

BEST MODE FOR CARRYING OUT THE INVENTION

Preferred embodiments of adaptive array communication system according to the present invention will be described below with reference to the accompanying drawings. The present invention is not limited to the embodiments.

Figure 1:
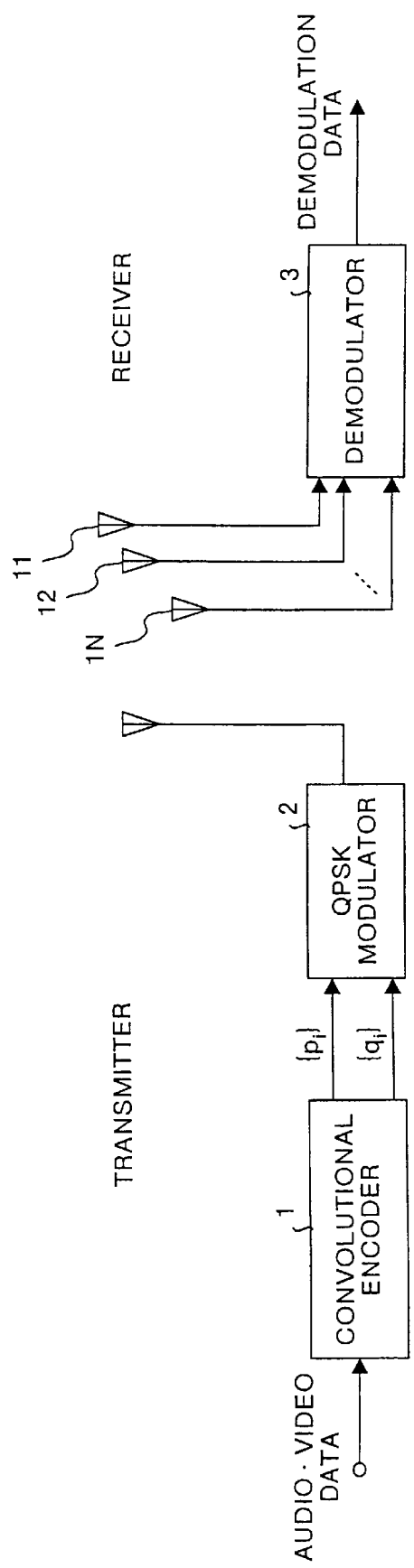
FIG. 1 is a diagram showing the configuration of a first embodiment of an adaptive array communication system according to the present invention.

FIG. 1 is a diagram showing the configuration of a first embodiment of an adaptive array communication system according to the present invention. Reference numeral 1 denotes a convolutional encoder in a transmitter for convolutionally encoding data such as audio data or video data. Reeference numeral 2 denotes a QPSK modulator for QPSK-modulating the convolutionally encoded data. Reference numerals 11, 12,..., 1N denote antennas of N branches in a receiver for receiving a signal from the transmitter. Reference numeral 3 denotes a demodulator for demodulating a received signal. The embodiments will be described by using a QPSK (Quadrature Phase Shift Keying) modulation method.

In FIG. 1, data such as audio data or video data is converted into a digital signal by an audio coder or the like (not shown) in a transmitter to obtain a data sequence to be transmitted. In a convolutional encoder 1 of the transmitter which receives the data sequence, the data sequence is convolutionally encoded at a coding rate R=½. The convolutional encoder 1 outputs an in-phase sequence $\{p_i\}$ and an orthogonal sequence $\{q_i\}$ (i is a subscript representing a symbol timing). Thereafter, a QPSK modulator 2 which receives the output signals performs QPSK modulation to the two sequences to output a signal amplified with respect to power by a radio-frequency amplifier or the like (not shown) as a transmission signal. On the other hand, the signal from the transmitter is received by a receiver having antennas 11, 12, . . . , 1N of N (integer) branches, amplified with respect to power by a radio-frequency amplifier or the like (not shown), and input into the demodulator 3. Thereafter, the demodulator 3 performs a demodulation process to the received signal.

Figure 2:
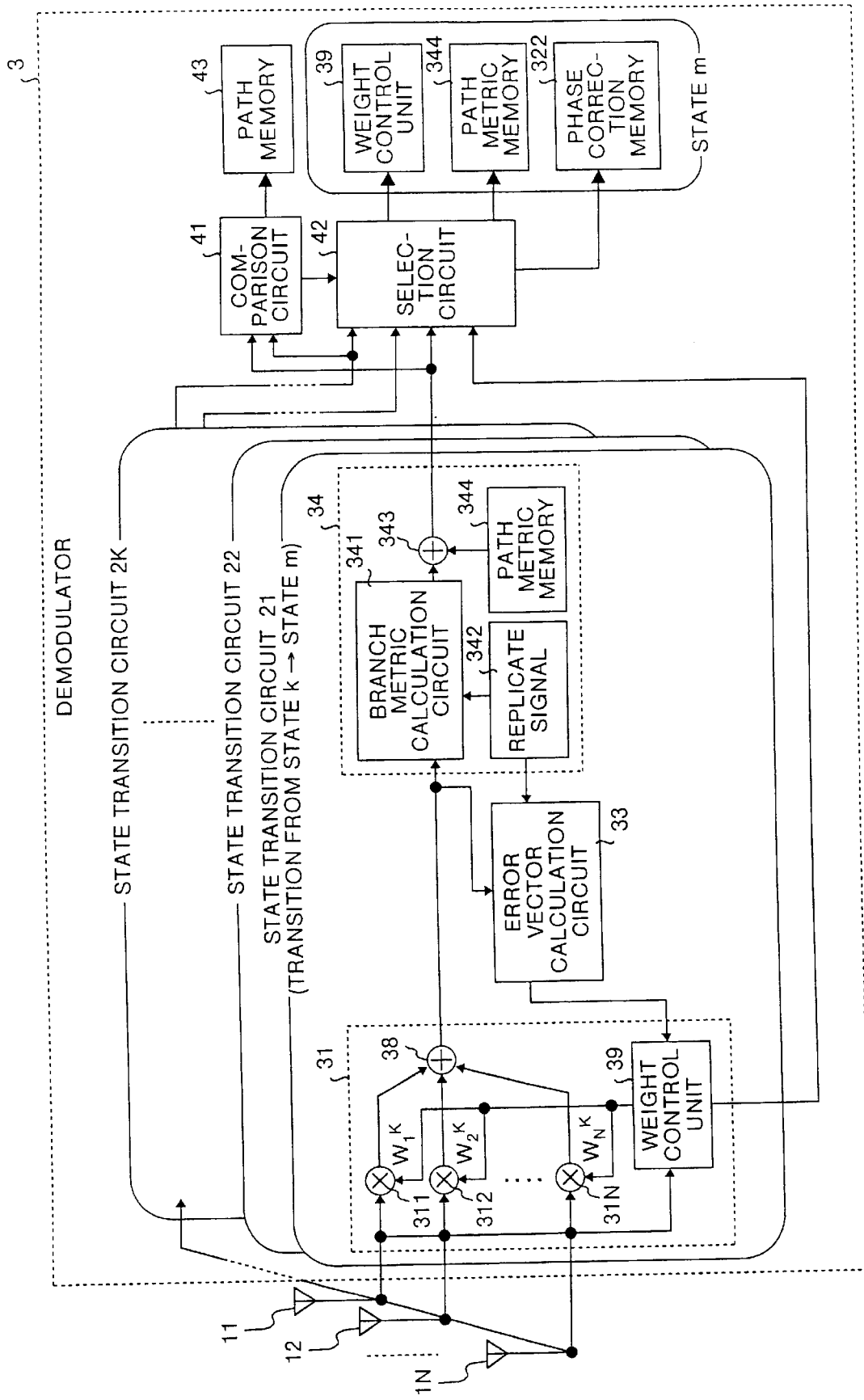
FIG. 2 is a diagram showing an example of the configuration of a demodulator 3.

The operation of the demodulator 3 in the receiver will be described below. FIG. 2 is a diagram showing an example of the configuration of the demodulator 3. Reference numerals 21, 22, . . . , 2K denote state transition circuits and reference numeral 41 denotes a comparison circuit for comparing outputs from the state transition circuits. Reference numeral 42 denotes a selection circuit for selecting a predetermined value depending on the comparison result and reference numeral 43 denotes a path memory for storing a surviving path. In the receiver constituted as described above, N received signal sequences input from the antennas 11 to 1N of the N branches are input into the demodulator 3 to be demodulated.

In the state transition circuit 21, 22, . . . , 2K, reference numeral 31 denotes an adaptive control unit. Reference numeral 33 denotes an error vector calculation circuit for comparing a received signal obtained after weighting combining and a reference signal (replicate signal) to calculate an error vector and reference numeral 34 denotes a decoding unit. In this manner, in the demodulator 3, the same state transition circuits 21 to 2K the number of which is equal to the number of states K (integer) of viterbi decoding exist in parallel. In the adaptive control unit 31, reference numeral 311, 312, . . . , 31N denote multipliers for multiplying complex weights to weight received signals. Reference numeral 38 denotes a combining unit for combining the weighted received signals. Reference numeral 39 denotes a weight control unit for outputting complex weights on the basis of an adaptive algorithm. In the decoding unit 34, reference numeral 341 denotes a branch metric calculation circuit for calculating a branch metric by using a received signal obtained after weighting combining and a reference signal and reference numeral 342 denotes a replicate signal output circuit for outputting a replicate signal. Reference numeral 343 denotes an adder which adds a branch metric and a path metric and reference numeral 344 denotes a path metric memory for storing a path metric. In this embodiment, for the sake of convenience, transition from a state k to a state m is described by using the state transition circuit 21. However, the same operation as described above is performed in transition to another state.

Basic operation of a general receiver using a viterbi decoder will be described below. For example, a discussion on a receiver for integrating a coherent detection function to a viterbi decoder to improve a characteristic is described in a reference "Phase Tracking Viterbi Demodulator" (Serizawa, Asakawa, and Murakami, Journal of The Institute of Electronics, Information and Communication Engineers B-II, Vol. J77-B-II No. 12 pp. 767–779, December, 1994).

Figure 3:
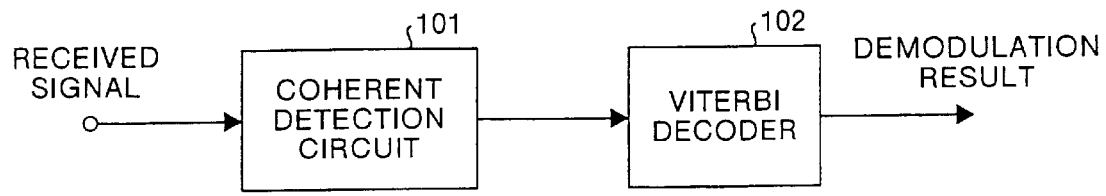
FIG. 3 is a diagram showing an example of the configuration of a conventional coherent detection circuit and a receiver using a viterbi decoder.

FIG. 3 is a diagram showing an example of the configuration of a receiver using a coherent detection circuit and a viterbi decoder. In the receiver, the received signal is coherently detected by the coherent detection circuit 101, and, thereafter, the coherent detection circuit 101 forms a recovered carrier having a phase synchronized on the basis of the received signal. The coherent detection circuit 101 decides the signs of the signals on the basis of the phase difference between the recovered carrier and the received signal.

FIG. 4 includes diagrams showing decision of signal signs performed by the coherent detection circuit 101. In FIG. 4, for example, a case using BPSK (Binary Phase Shift Keying) modulation method is shown. In the BPSK modulation, when the absolute value of the phase difference between the recovered carrier and the received signal is, $\pi/2$ or less, the code of the received signal is decided as 0. On the other hand, when the absolute value is $\pi/2$ or more, the code of the received signal is decided as 1. More specifically, when phase synchronization between the recovered carrier and the received signal is perfect, point A' is included in a hatched portion as shown in FIG. 4(a). For this reason, the coherent detection circuit 101 can correctly decide the received signal as 0, and bit error rate performance is not degraded. On the other hand, in a transmission channel environment of mobile communication, in general, the phases of the recovered carrier and the carrier of the received signal are not completely synchronized with each other due to the influence of phase shift caused by fading or the like. For this reason, the point A' is not included in the hatched portion as shown in FIG. 4(b), the code of the point A' is erroneously decided as 1, and bit error rate in the receiver is degraded.

Figure 5:
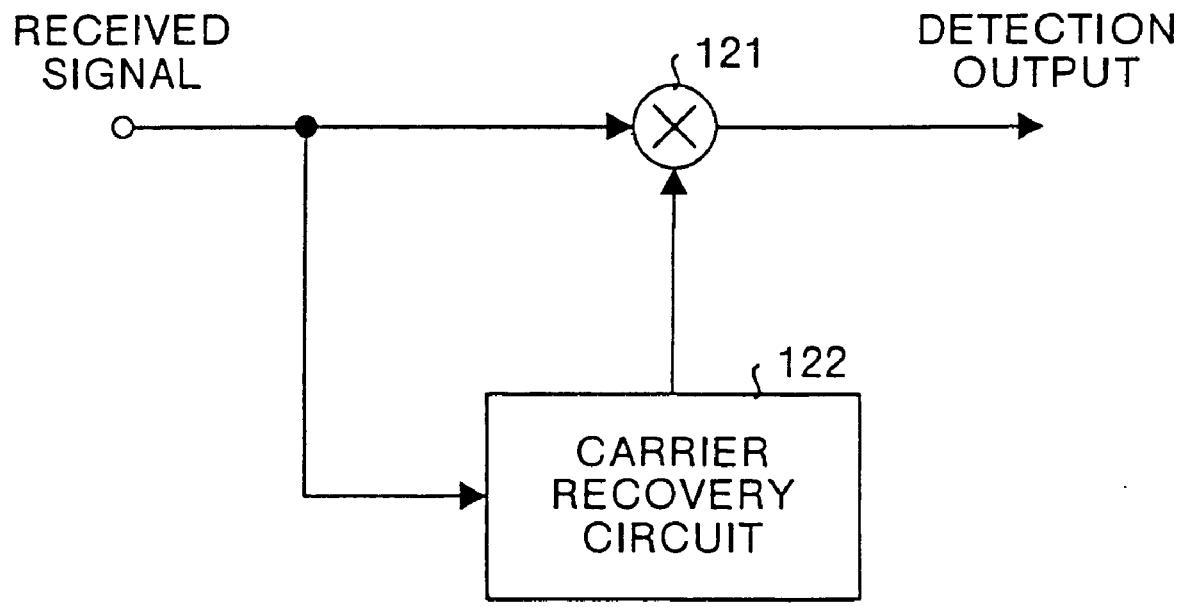
FIG. 5 is a diagram showing an example of the configuration of the coherent detection circuit 101.

FIG. 5 is a diagram showing an example of the configuration of the coherent detection circuit 101. Reference numeral 121 denotes a multiplier and reference numeral 122 denotes a carrier recovery circuit. Received signal input into the coherent detection circuit 101 is input into the carrier recovery circuit 122, and a recovered carrier is generated by the carrier recovery circuit 122. At the same time, the received signal is input into the multiplier 121 and coherently detected by a recovered carrier which is output from the carrier recovery circuit 122.

Figure 6:
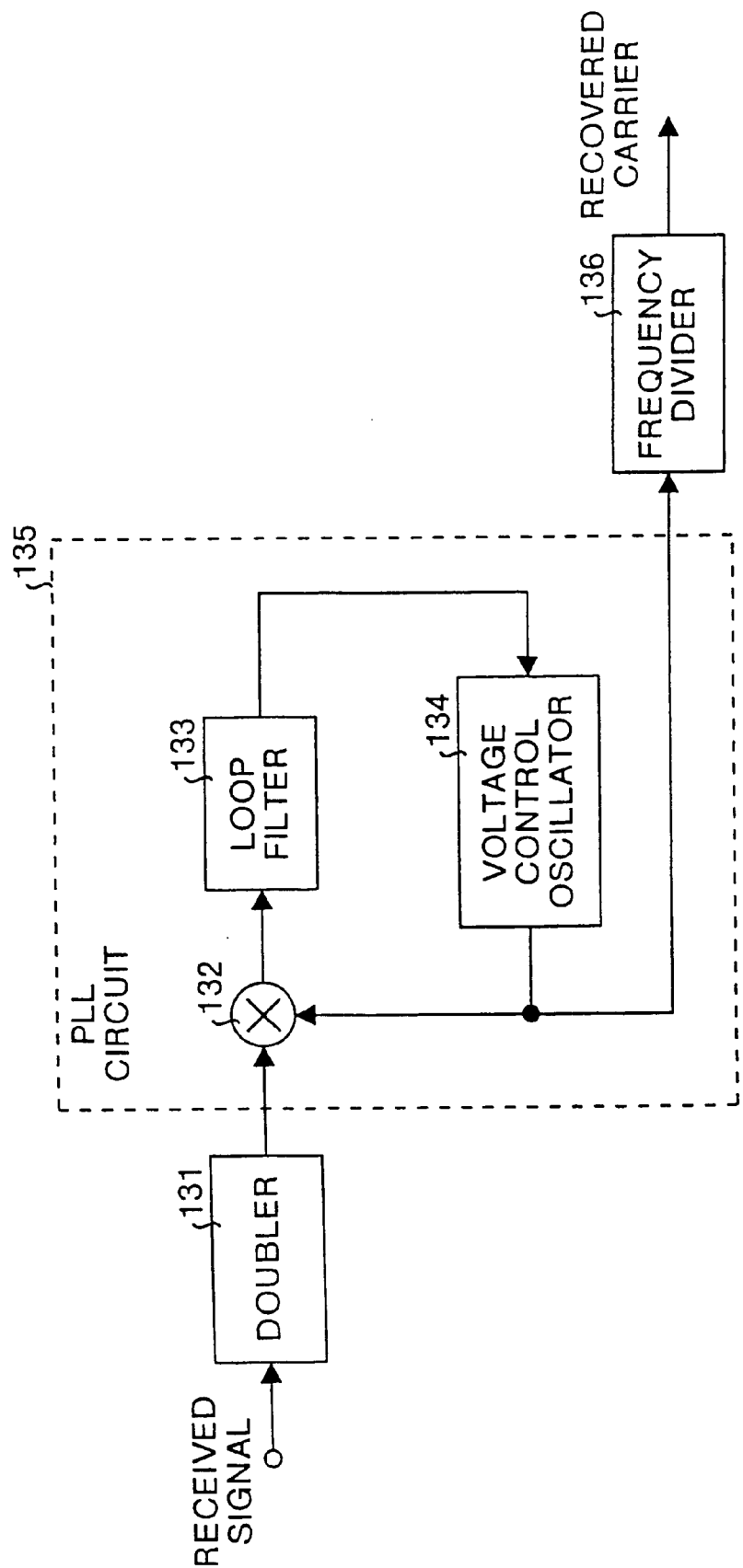
FIG. 6 is a diagram showing an example of the configuration of a carrier recovery circuit 122.

FIG. 6 is a diagram showing an example of the configuration of the carrier recovery circuit 122. Reference numeral 131 denotes a phase doubler. Reference numeral 135 denotes a PLL circuit constituted by a multiplier 132, a loop filter 133, and a voltage control oscillator 134. Reference numeral 136 denotes a frequency divider. Received signal input into the carrier recovery circuit 122 is doubled by the doubler 131. When the received signal is doubled, a constant phase can be obtained independently of a signal sign. More specifically, in the BPSK, when the code is 0, the phase of the signal is 0. When the code is 1, the phase of the signal is $\pi$. For this reason, when the signals are doubled, these signal phases are 0 and $2\pi$, respectively, and are equal to each other. An output from the doubler 131 is input into the PLL circuit 135. In the PLL circuit 135, a signal which is synchronized with the transmission carrier in phase and has an increased S/N ratio (signal-to-noise ratio). Finally, in the frequency divider 136, a received signal is frequency-divided by two to output a recovered carrier.

Figure 7:
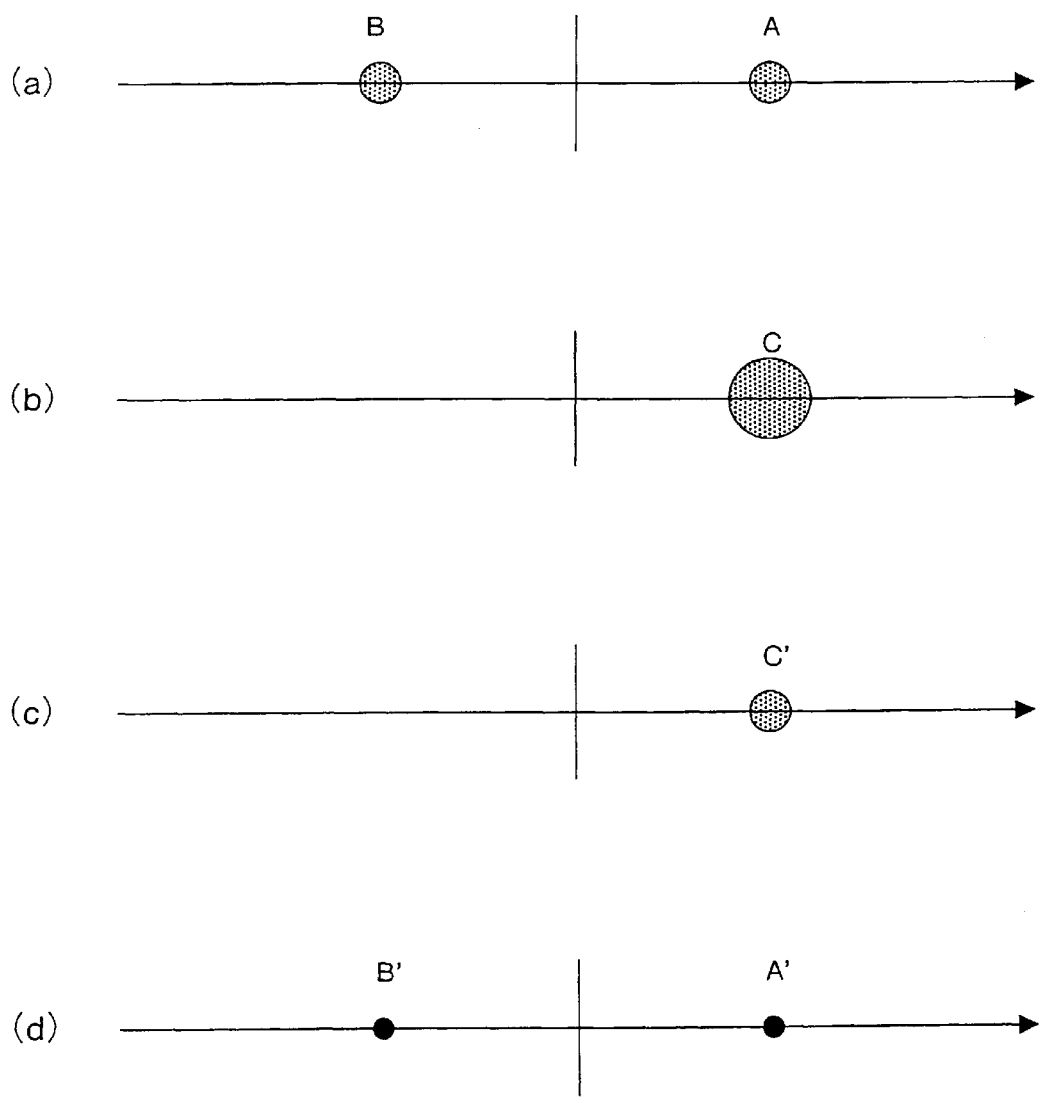
FIG. 7 includes diagrams for explaining the phase ambiguity of a recovered carrier.

In the coherent detection circuit 101, phase ambiguity caused by doubling is posed as a problem. FIG. 7 includes graphs for explaining the phase ambiguity of a recovered carrier. For example, when noise is generated, the received signal is distributed in range A in FIG. 7(a) when a decision value obtained by the coherent detection circuit 101 is 0, and the received signal is distributed in range B when the decision value is 1. In this case, when the received signal is doubled, an output from the doubler 131 has a characteristic indicated by C in FIG. 7(b). In addition, when the output is input into the PLL circuit 135 to increase the S/N ratio, a distribution range of an output from the PLL circuit 135 obtained by noise is narrowed as indicated by C' in FIG. 7(c). Finally, the output from the PLL circuit 135 is divided by two by the frequency divider 136, the recovered carrier has two states indicated by A' and B' shown in FIG. 7(d). More specifically, the recovered carrier has two stable points, and phase ambiguity of 180° exists. Therefore, bit error rate performance is degraded.

Figure 8:
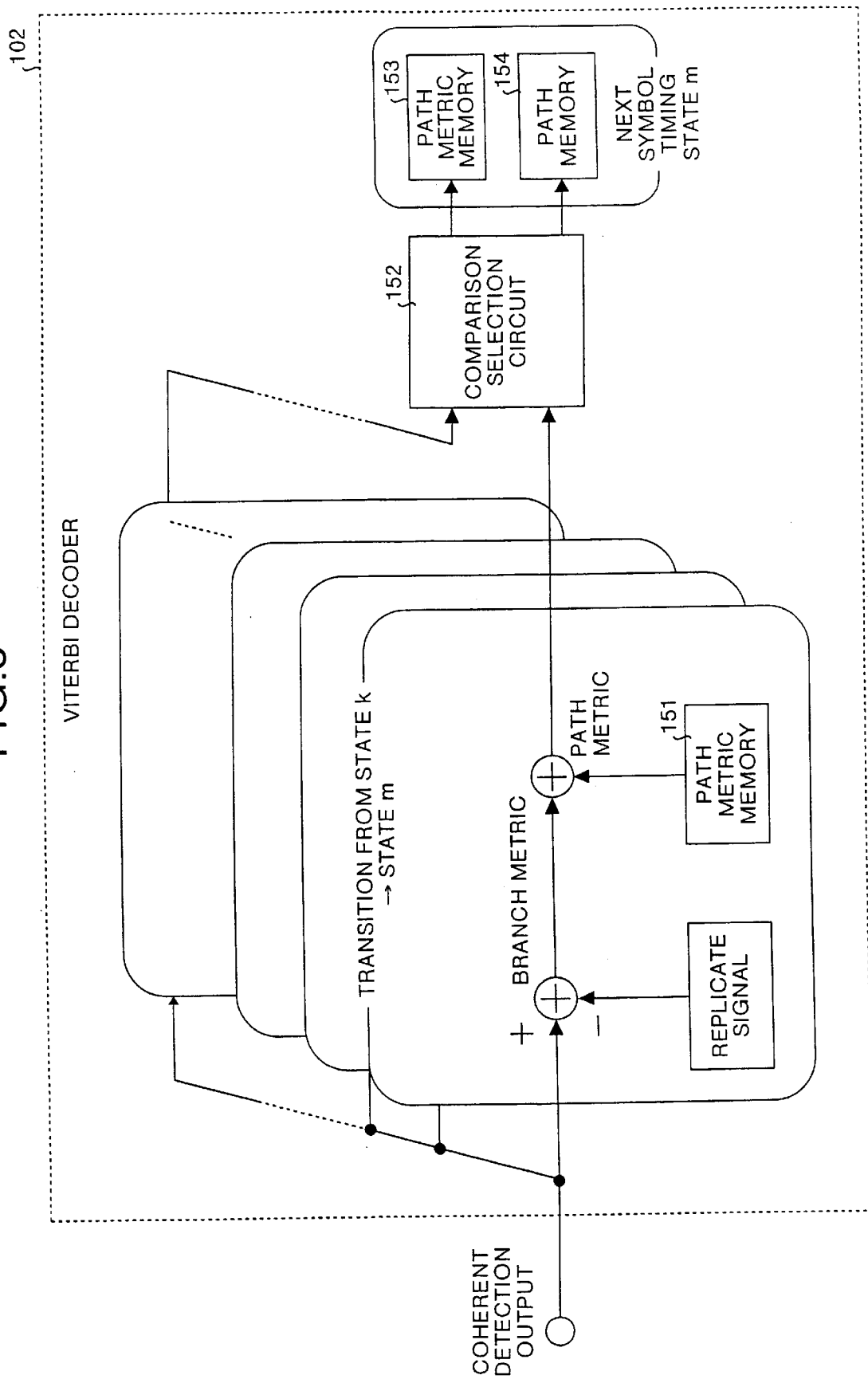
FIG. 8 is a diagram showing an example of the configuration of a viterbi decoder 102.

Next, an output from the coherent detection circuit 101 is input into the viterbi decoder 102. FIG. 8 is a diagram showing an example of the configuration of the viterbi decoder 102. Only transition from a state k of the viterbi decoder 102 to a state m of the viterbi decoder 102 is described. However, the same operation as described below is performed in another state transition. For example, when a received signal is input at a certain symbol timing, the viterbi decoder 102 calculates a branch metric by comparing the received signal and a replicate signal with each other. In this case, a signal output from a convolutional encoder when a convolutional encoder on the transmission side is changed from the state k to the state m is an ideal replicate signal (known signal). Therefore, under an ideal condition being free from noise and fading, a received signal and a replicate signal are equal to each other, and the reliability of a branch from the state k to the state m can be determined by the degree of equality between the replicate signal.

The obtained branch metric is added to a path metric stored in a path metric memory 151 of the state k. The path metric in the state k is a value representing the reliability of the state k including past transition. Therefore, when a branch metric is added to the path metric in the state k, the reliability of a path from the state k to the state m including past transition can be calculated. The added metric is input into a comparative selection circuit 152. The comparative selection circuit 152 performs calculation related to comparison/selection with respect to the added metric and metrics in another state transition. As a result, a more reliable path is determined as a surviving path of the state m at the next symbol timing. For example, when the more reliable path is selected as transition from the state k to the state m, the metric is stored in a path metric memory 153 of the state m, and the past transition related to the path is stored in a path memory 154.

When this operation is performed to all symbol timings, in the viterbi decoder 102, finally, a most reliable state and a most likely path retraced from the most reliable state to a past state are selected.

Figure 9:
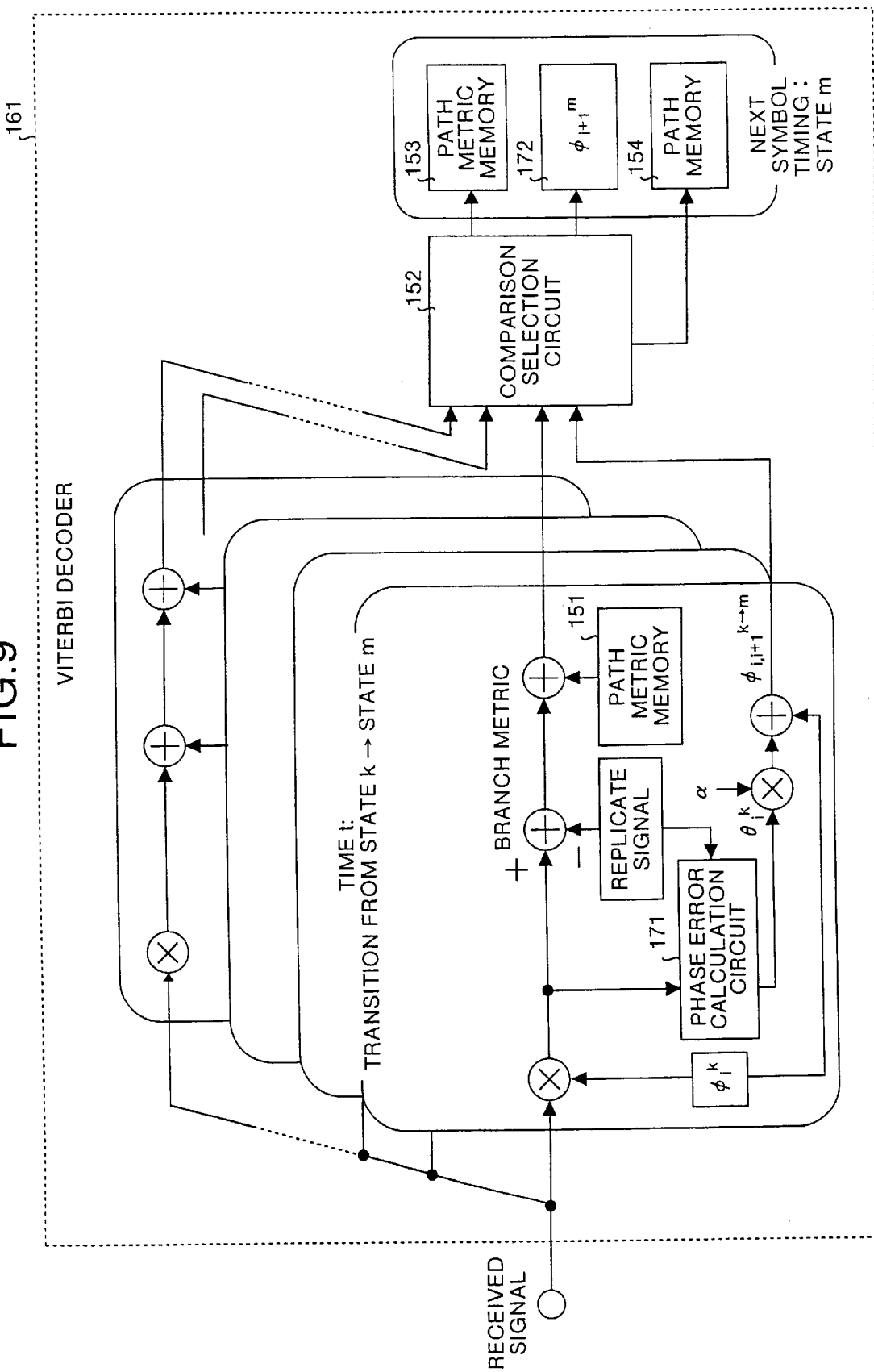
FIG. 9 is a diagram showing the configuration of a receiver using a viterbi decoder integrated with a coherent detection function.

FIG. 9 is a diagram showing the configuration of a receiver using a viterbi decoder integrated with a coherent detection function. In other words, this diagram shows an example of the configuration of a viterbi decoder 161. In FIG. 9, a received signal is input into the viterbi decoder 161 without being detected by a coherent detection circuit to obtain a demodulation result. For example, the viterbi decoder 161 shown in FIG. 9 causes different phase amounts to correspond to the respective states of the viterbi decoder 102 shown in FIG. 3. Phase correction is performed to an input received signal every state. The phase correction corresponds to phase detection. Thereafter, viterbi decoding is performed to the received signal subjected to the phase correction, updating of a path metric and the phase correction amounts being along a more likely path is performed. According to this method, phase ambiguity caused by doubling in the coherent detection circuit 101 as described above can be avoided. Also, under a condition having an extremely low S/N (signal power to noise power ratio), stable demodulation can be performed.

The operation of the viterbi decoder 161 will be described below. The same reference numerals as in the configuration shown in FIG. 8 denote the same parts in FIG. 9, and a description of the operation of the configuration will be omitted. In the state k, an input signal is subjected to phase correction by phase correction values which are different from each other for the respective states. For example, when a phase correction amount is represented by $\phi_i^k$, the input signal is multiplied by $\exp(-j\phi_i^k)$. The signal subjected to the phase correction and a replicate signal are used to calculate a branch metric corresponding to a transition from the state k to the state m as described above. Thereafter, in the comparative selection circuit 152, by using a metric obtained by adding the path metric and the branch metric, a comparison/selection process of the metric and a metric in another state transition is performed. The result of the process is stored in the path metric memory 153 of the state m and the path memory 154. In synchronous with the generation of the branch metric, a phase error calculation circuit 171 which receives the received signal subjected to the phase correction compares the phase of the received signal with the phase of the replicate signal to calculate a phase error $\theta_i^k$. In this case, since the replicate signal is an ideal received signal, the phase of the received signal is compared with the phase of the replicate signal, so that a phase error in coherent detection can be calculated without removing a signal sign. Thereafter, the phase error $\theta_i^k$ is multiplied by a gain $\alpha$ and then added to the phase correction amount $\phi_i^k$ in the state k to calculate a candidate of a phase correction value in the state m. More specifically, $$\phi_{i,1+1}^{k\to m} = \phi_i^k + \alpha\theta_i^k \tag{5}$$

is satisfied.

The candidate of the phase correction amount in the state m is input into the comparative selection circuit 152 together with the metric, and a phase correction amount having a large metric value is selected as a phase correction amount in the state m. With this operation, updating of the phase correction having a large metric value and being along a more reliable path can be performed, and a phase error $\phi_{i+1}^m$ in the state m is stored in a phase error memory 172. In this manner, an influence caused by the above multiplying can be avoided, and an improvement of the bit error rate performance can be expected.

The operation of the demodulator 3 in the receiver of this embodiment will be described below with reference to FIG. 2. N received signal sequences input into the demodulator 3 are received by the adaptive control unit 31 and input into the N multipliers 311 to 31N. In the multipliers 311 to 31N, a plurality of complex weights $W_{j,i}^k$ (where, k (1 to K) represents a state, and j (1 to N) represents an input antenna branch of a signal) which are output from the weight control unit 39 and which are different from each other for the respective states. In this case, the received signal is weighted. This weighting is performed such that a desired wave component in a weighted/combined signal and an interference wave component is minimized. Thereafter, the N weighted received signals are combined by the combining unit 38. For example, when received signals input into the multipliers 311 to 31N are represented by $x_{j,i}$, and when an output from the combining unit 38 is represented by $r_i^k$, the following equation is satisfied:

$$r_i^k = \sum_{j=1}^{N} w_{j,i}^k x_{j,i} \tag{6}$$

In this manner, weighting addition performed by the adaptive control unit 31, as described in Equation (6), is the same weighting addition as that in the adaptive array communication system described in the background art. However, in this embodiment, this weighting addition is performed to all the states.

The output $r_i^k$ from the combining unit 38 is received by the decoding unit 34. Here, the output is input into the branch metric calculation circuit 341 to calculate a branch metric $B_{i,i+1}^{k \to m}$. For example, when the replicate signal is represented by $a_i^k$, the branch metric $B_{i,i+1}^{k \to m}$ is calculated by the following equation:

$$B_{i,i+1}^{k \to m} = |a_i^k - r_i^k|^2 \qquad (7)$$

The branch metric $B_{i,i+1}^{k \to m}$ output from the branch metric calculation circuit 341 is input into the adder 343. In the adder 343, the branch metric $B_{i,i+1}^{k \to m}$ is added to the path metric $P_i^k$ in the state k output from the path metric memory 344. More specifically, the metric $M_{i,i+1}^{k \to m}$ output from the adder 343 is calculated by the following equation:

$$M_{i,i+1}^{k \to m} = P_i^k + B_{i,i+1}^{k \to m} \qquad (8)$$

The metric $M_{i,i+1}^{k \to m}$ corresponding to a transition from the state k to the state m output from the adder 343 is input into a selection circuit 42 and, input into a comparison circuit 41. In the comparison circuit 41, the metric $M_{i,i+1}^{k \to m}$ corresponding to the transition from the state k to the state m is compared with a metric corresponding to a transition from another state to the state m, a path having a large metric, i.e., a signal representing a more reliable path is output to the selection circuit 42. For example, when the metric $M_{i,i+1}^{k \to m}$ corresponding to the transition from the state k to the state m is larger than the metric corresponding to the transition from another state to the state m, the comparison circuit 41 outputs 0 to the selection circuit 42. Otherwise, the comparison circuit 41 outputs 1 to the selection circuit 42. The following description the metric will be performed on the assumption that $M_{i,i+1}^{k \to m}$ corresponding to the transition from the state k to the state m is larger than the metric corresponding to the transition from another state to the state m.

Finally, in the comparison circuit 41, a state which is a transition source of the more reliable path, i.e., the state k is stored in a path memory 43 in the state m. In addition, in the selection circuit 42, on the basis of the comparison result in the comparison circuit 41, the metric $M_{i,i+1}^{k \to m}$ corresponding to the transition from the state k to the state m is stored in the path metric memory 344 of the state m.

An output $r_i^k$ from the combining unit 38 is input into the branch metric calculation circuit 341. At the same time, the output $r_i^k$ is input into the error vector calculation circuit 33. In the error vector calculation circuit 33, the output $r_i^k$ is compared with a replicate signal $a_i^k$ with each other according to the following equation to calculate an error vector $\epsilon_i^k$:

$$\epsilon_i^k = a_i^k - r_i^k \qquad (9)$$

The error vector $\epsilon_i^k$ corresponds to an error signal described in the background art. For example, since a replicate signal $a_i^k$ can be considered as an ideal received signal corresponding to the transition from the state k to the state m, the replicate signal $a_i^k$ is compared with the signal $r_i^k$, the error vector $\epsilon_i^k$ corresponding to an error signal in the adaptive array communication system. In this manner, in this embodiment, the demodulator 3 comprises an error signal deriving function for each state. In this case, a signal corresponding to an error signal in the conventional receiver is called an error vector.

After the error vector is calculated, the error vector $\epsilon_i^k$ output from the error vector calculation circuit 33 is received by the adaptive control unit 31 and input into the weight control unit 39. In the weight control unit 39, complex weights $w_{j,i}^k$ to be supplied to the multipliers 311 to 31N are updated on the basis of the adaptive algorithm by using the error vector $\epsilon_i^k$. For example, when an LMS algorithm is applied as the adaptive algorithm, the complex weights are updated (controlled) by the following equation:

$$w_{j,i+1}^{k \to m} = w_{j,i}^k + 2\mu x_{j,i}^* \epsilon_i^k \qquad (10)$$

According to Equation (10), the complex weight $w_{j,i}^k$ is controlled to an optimum value such that a desired wave is maximized in an array output and an interference wave is minimized. In this manner, in this embodiment, the demodulator 3 comprises an adaptive control function in each state. In this embodiment, since it is assumed that the state transition from the state k to the state m is more reliable than the state transition from another state to the state m, a complex weight $w_{j,i+1}^m$ in the next state m is updated by a complex weight $w_{j,i+1}^{k \to m}$. More specifically, $$w_{j,i+1}^m = w_{j,i+1}^{k \to m} \qquad (11)$$

is satisfied.

Finally, the updated complex weight $w_{j,i+1}^{k \to m}$ is notified to the selection circuit 42 as a candidate of a complex weight in the next state m. In the selection circuit 42, complex weights are selected depending on outputs from the comparison circuit 41 to update the weight control unit 39 corresponding to the state m at the next symbol timing. More specifically, when 0 is output from the comparison circuit 41, the selection circuit 42 selects the complex weight $w_{j,i+1}^{k \to m}$ corresponding to the transition from the state k to the state m to input the complex weight $w_{j,i+1}^{k \to m}$ to the weight control unit 39 of the state m.

In this manner, in the demodulator 3 according to this embodiment, the above process is performed to all state transitions at a certain symbol timing and received signals at all the symbol timings. When a most likely path retraced from the most reliable state to a past state are selected, the contents of a path memory corresponding to the path are output as a likelihood sequence. In this manner, the demodulator 3 can output the maximum likelihood sequence to the convolutional encoding series. More specifically, an output from the demodulator 3 is decoded by the subsequent audio decoder or the like (not shown) and output as data such as audio data or video data.

Figure 19:
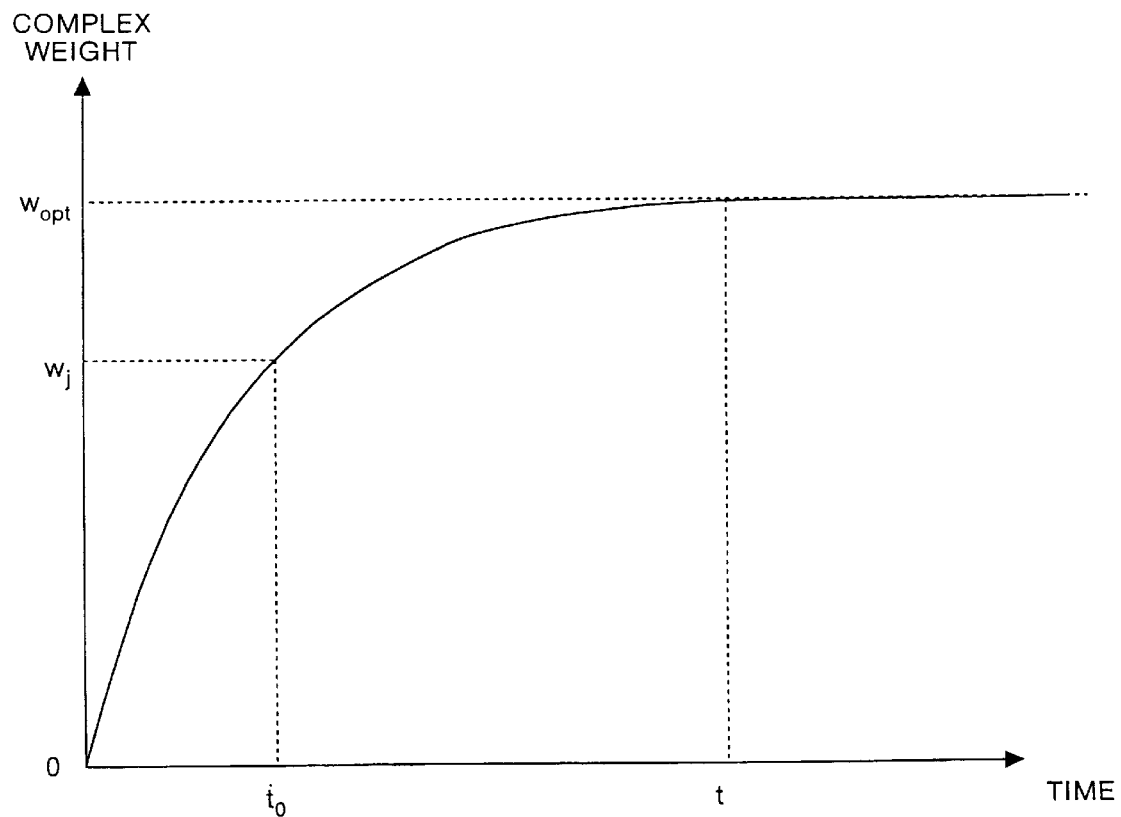
FIG. 19 is a graph showing a change in complex weight with time.
Figure 20:
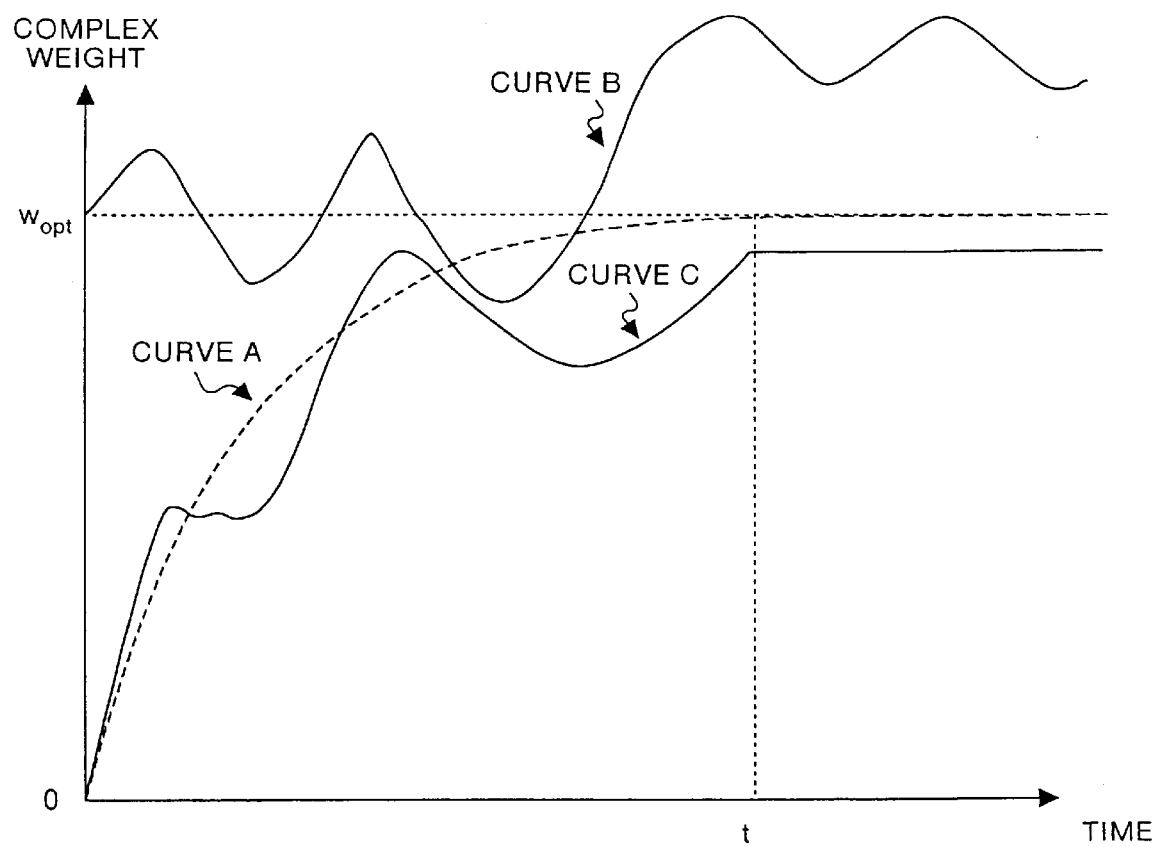
FIG. 20 is a graph showing a change in complex weight with time.

As described above, this embodiment employs a configuration comprising in which the weight control units 39 which can supply optimum complex weights to multipliers and the adaptive control units 31 including N multipliers for maximizing desired wave components and minimizing interference wave components in weighted/combined signals and the combining unit 38 are arranged for the respective states in viterbi decoding. In this manner, optimum complex weights can be calculated for the respective states, and the optimum complex weights can be updated along a maximum-likely path of the viterbi decoding. More specifically, since adaptive array control can be performed for each state of the viterbi decoding, even though a reference signal sequence length is small as shown in FIG. 19 described above, a correct complex weight can always be calculated. In addition, even though a complex weight varies with time in one burst period, the adaptive array communication system can easily follow the complex weight. For this reason, a preferable demodulation characteristic can be realized.

In the embodiment described above, an LMS algorithm which has a small calculation amount and requires relatively long time to converge a complex weight is applied as an adaptive algorithm used in the weight control unit 39. However, the LMS algorithm is not necessarily used. For example, when an RLS algorithm which sequentially calculates inverse matrixes is applied, a calculation amount larger than that of the LMS algorithm is required, a convergent rate of the complex weight can be increased. The RLS algorithm is described in reference "Introduction to Adaptive Filters" Chapter V (S. Haykin, translated by Take be Tuyoshi, Gendai Kogaku shya, Third Edition, on Mar. 10, 1994) in detail. For this reason, in the embodiment, the description thereof will be omitted for descriptive convenience.

The case in which the RLS algorithm is applied to an adaptive array system is described in the reference "Adaptive Array for Mobile Radio" (Ohgane, Ogawa, Journal of The Institute of Electronics, Information and Communication Engineers, November 1998 to March 1999) in detail. More specifically, when a weight is calculated by applying the RLS algorithm, the weight can be calculated by using the following Equation (12):

$$w_{j,i+1} = w_{j,i} + R_{xx}^{-1} x_{j,i} * \epsilon_i \quad (12)$$

where $R_{xx}^{-1}$, is an inverse matrix of a correlative matrix of a received signal.

In general, since calculation for calculating an inverse matrix is complex, in the RLS algorithm, a matrix-inversion lemma is applied to $R_{xx}^{-1}{}_i$, and $R_{xx}^{-1}{}_i$ is sequentially updated by using the Equation (13), so that complex inverse matrix calculation is omitted.

$$R_{xx}^{-1i} = \frac{1}{q} R_{xx}^{-1i-1} - \frac{1}{q} \cdot \frac{R_{xx}^{-1i-1} x_{j,i}^T R_{xx}^{-1i-1}}{q + x_{j,i}^T R_{xx}^{-1i-1} x_{j,i}} \quad (13)$$

where $o < q \leq 1$, and T represents displacement.

In this manner, since a part having a constant of $2\mu$ in the LMS algorithm is replaced with $R_{xx}^{-1}{}_i$ calculated by sequential updating according to Equation (13), calculation required for updating is complex in the RLS algorithm. In the LMS algorithm, an amount of variance of a weight controlled by performing updating once for a correct value is dependent on the constant of $2\mu$. In contrast to this, in the RLS algorithm, the amount of variance is dependent on a time mean by using the correlative matrix $R_{xx}^{-1}{}_i$. However, although an optimum weight of an adaptive algorithm is essentially calculated by a set mean of infinite time, the time mean is asymptotic to the set mean if the number of samples is large. Therefore, estimated weight by performing calculation once is more close to an optimum weight when the RLS algorithm is applied. As a result, convergent rate can be increased.

Figure 10:
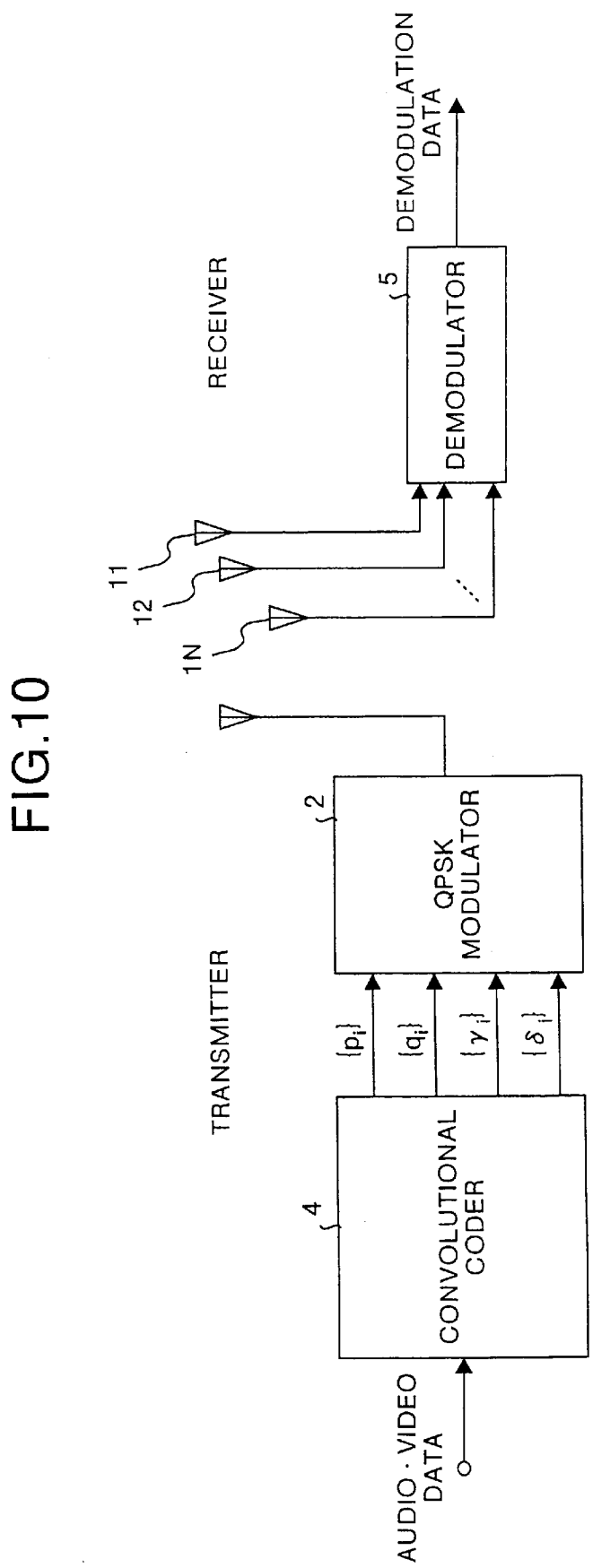
FIG. 10 is a diagram showing the configuration of a second embodiment of an adaptive array communication system according to the present invention.

FIG. 10 is a diagram showing the configuration of a second embodiment of an adaptive array communication system according to the present invention. In FIG. 10, a convolutional encoder in a transmitter which can make a coding rate variable and a demodulator in a receiver which can demodulate a signal from the transmitter. The same reference numerals as in the configuration of a first embodiment denote the same parts in FIG. 10, and a description thereof will be omitted.

For example, in the first embodiment described above, as shown in FIG. 1, although a coding rate R of the convolutional encoder 1 is set to be ½, the coding rate R is not necessarily set to be ½. Therefore, the adaptive array communication system of the embodiment shown in FIG. 10 employs a configuration in which a coding rate can be made variable. More specifically, for example, when punctured coding which can realize a high coding rate is used as a coding method, i.e., when part (block of a predetermined symbol position) of a convolutional coding bit is periodically erased, the coding rate R may be set to be (n−1)/n or the like (n is an integer). In this manner, since the coding rate can be increased by executing the punctured coding, transmission efficiency can be improved.

In addition to the above description, the coding rate R is set to be 1/n, so that error correction capability may be improved. As shown in FIG. 10, for example, when the coding rate R is set to be ¼, the error correction capability can be improved in comparison with the case of R=½. When R=¼, four outputs from a convolutional encoder 4 are ($\{p_i\}$, $\{q_i\}$, $\{\gamma_i\}$, $\{\delta_i\}$). For this reason, for example, when modulation is performed by using a QPSK modulator 2 as in the first embodiment, a demodulator 5 operates on the basis of two consecutive symbols.

The operation of the demodulator 5 in this embodiment will be described below. Only different portions between this embodiment and the first embodiment described above will be described. The demodulator 5 can be realized by the same circuit configuration as that of the demodulator 3 described above. However, the demodulator 5 is different from the demodulator 3 in calculation contents. In this case, it is assumed that four sequences which are convolutionally encoded are represented by $\{p_i\}$, $\{q_i\}$, $\{\gamma_i\}$, and $\{\delta_i\}$, and that $\{p_i\}$ and $\{q_i\}$ and $\{\gamma_i\}$ and $\{\delta_i\}$ are transmitted as symbols $\pi_{h-1}$ and $\pi_h$ one by one, respectively. Reference symbol h is a subscript representing a symbol timing, and a symbol rate is twice a data rate obtained before convolutional encoding (h=2i).

In the demodulator 5, outputs from a combining unit 38 corresponding to the symbols $\pi_{h-1}$ and $\pi_h$ are represented by $r_{h-1}{}^k$ and $r_h{}^k$. Since replicate signals are outputs from the convolutional coder 4 corresponding to state transitions, a replicate signal in case of R=¼ is constituted by two symbols. Therefore, the replicate signals are represented by $b_{h-1}{}^k$ and $b_h{}^k$, respectively. In an error vector calculation circuit 33, two error vectors $\epsilon_h{}^k$ and $\epsilon_{h-1}{}^k$ are calculated by the following equation:

$$\epsilon_{h-1}{}^k = b_{h-1}{}^k - r_{h-1}{}^k \quad (14)$$

$$\epsilon_h{}^k = b_h{}^k - r_h{}^k \quad (14)$$

In the weight control unit 39, for example, when the LMS algorithm is applied, complex weights are controlled by the following equation:

$$i\, w_{j,h+1}{}^{k \to m} = w_{j,h}{}^k + 2\mu(x_{j,h-1} * \epsilon_{h-1}{}^k + x_{j,h} * \epsilon_h{}^k) \quad (15)$$

In this embodiment, the same effect as that of the first embodiment can be obtained, and transmission efficiency can be improved by increasing a coding rate to (n−1)/n by using punctured coding. In addition, when the coding rate is set to be 1/n, error correction capability can be improved. In the embodiment, the demodulator 5 performs state transition and a decoding process each time the demodulator 5 receives two symbols. However, this operation is a correct operation which can obtain one decoding data for four convolutionally coded signals.

Figure 11:
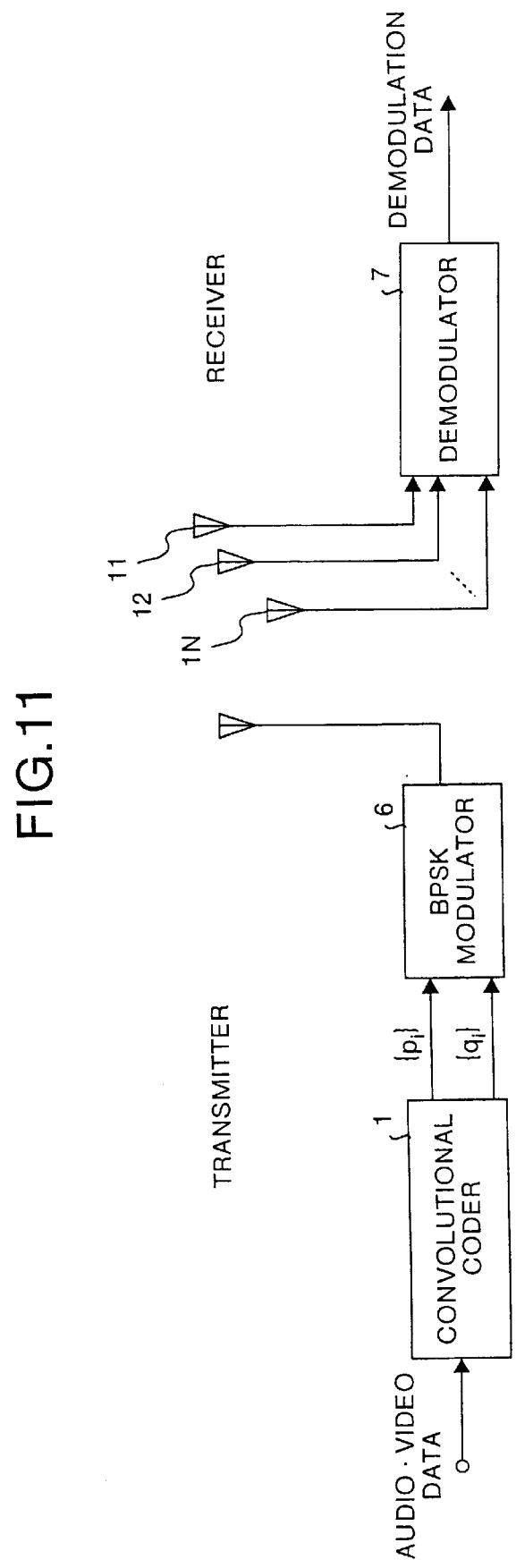
FIG. 11 is a diagram showing the configuration of a third embodiment of an adaptive array communication system according to the present invention.

FIG. 11 is a diagram showing the configuration of a third embodiment of an adaptive array communication system according to the present invention. In FIG. 11, the adaptive array communication system comprises a BPSK modulator using a BPSK (Binary Phase Shift Keying) method. The same reference numerals as in the first embodiment denote the same parts in FIG. 11, and a description thereof will be omitted.

The difference between BPSK modulation and QPSK modulation will be described first. FIG. 14 includes graphs showing examples of signal mapping in the digital modulations. More specifically, FIG. 14(a) shows a signal mapping in the BPSK modulation, and FIG. 14(b) shows a signal mapping in the QPSK modulation. As is apparent from FIG. 14(b), in the QPSK modulation, because of giving pieces of information to an in-phase direction and an orthogonal direction, 2-bit information can be transmitted by one symbol. In contrast to this, in the BPSK modulation, as shown in FIG. 14(a), information to the in-phase direction, only 1-bit information can be transmitted by one symbol. Therefore, from the viewpoint of band use efficiency, the QPSK modulation is better than the BPSK modulation. However, from the viewpoint of easiness of mapping, i.e., the viewpoints of a reduction in size of the device and a reduction in power consumption, the BPSK modulation is better.

In the first embodiment, although the QPSK modulation method is used, the QPSK is not necessarily used. For example, as shown in FIG. 11, by using the BPSK modulation method, mapping may be simplified. In this case, the convolutional encoding sequence $\{p_i\}$ from the convolutional encoder 1 having a coding rate of R=½ is transmitted as one symbol, and the encoding sequence $\{q_i\}$ is consecutively transmitted as another symbol. A demodulator 7 in FIG. 11 operates on the basis of two consecutive symbols as in the second embodiment.

The operation of the demodulator 7 in this embodiment will be described below. Only different portions between this embodiment and the first embodiment described above will be described. The demodulator 7 can be realized by the same circuit configuration as that of the demodulator 3 described above. However, the demodulator 7 is different from the demodulator 3 in calculation contents. In this case, it is assumed that two sequences which are convolutionally encoded are represented by $\{p_i\}$ and $\{q_i\}$, and that $\{p_i\}$ and $\{q_i\}$ are transmitted as symbols $P_{h-1}$ and $\rho_h$ one by one, respectively. Reference symbol h is a subscript representing a symbol timing, and a symbol rate is twice a data rate obtained before convolutional encoding (h=2i).

In the demodulator 7, outputs from a combining unit 38 corresponding to the symbols $\rho_{h-1}$ and $\rho_h$ are represented by $r_{h-1}^k$ and $r_h^k$. Since replicate signals are outputs from the convolutional encoder 1 corresponding to state transitions, a replicate signal in case of the BPSK modulation is constituted by two symbols. Therefore, the replicate signals are represented by $c_{h-1}^k$ and $c_h^k$, respectively. In an error vector calculation circuit 33, two error vectors $\epsilon_h^k$ and $\epsilon_{h-1}^k$ are calculated by the following equation:

$$\epsilon_{h-1}^k = c_{h-1}^k - r_{h-1}^k$$
$$\epsilon_h^k = c_h^k - r_h^k \quad (16)$$

In the weight control unit 39, for example, when the LMS algorithm is applied, complex weights are controlled by the same manner as that expressed by Equation (15) described above.

In this embodiment, the same effect as that of the first embodiment can be obtained, and mapping can be simplified by using the BPSK modulation method. In this embodiment, the demodulator 7 performs state transition and a decoding process each time the demodulator 7 receives two symbols. However, this operation is a correct operation which can obtain one decoding data for two convolutionally encoded signals.

Figure 12:
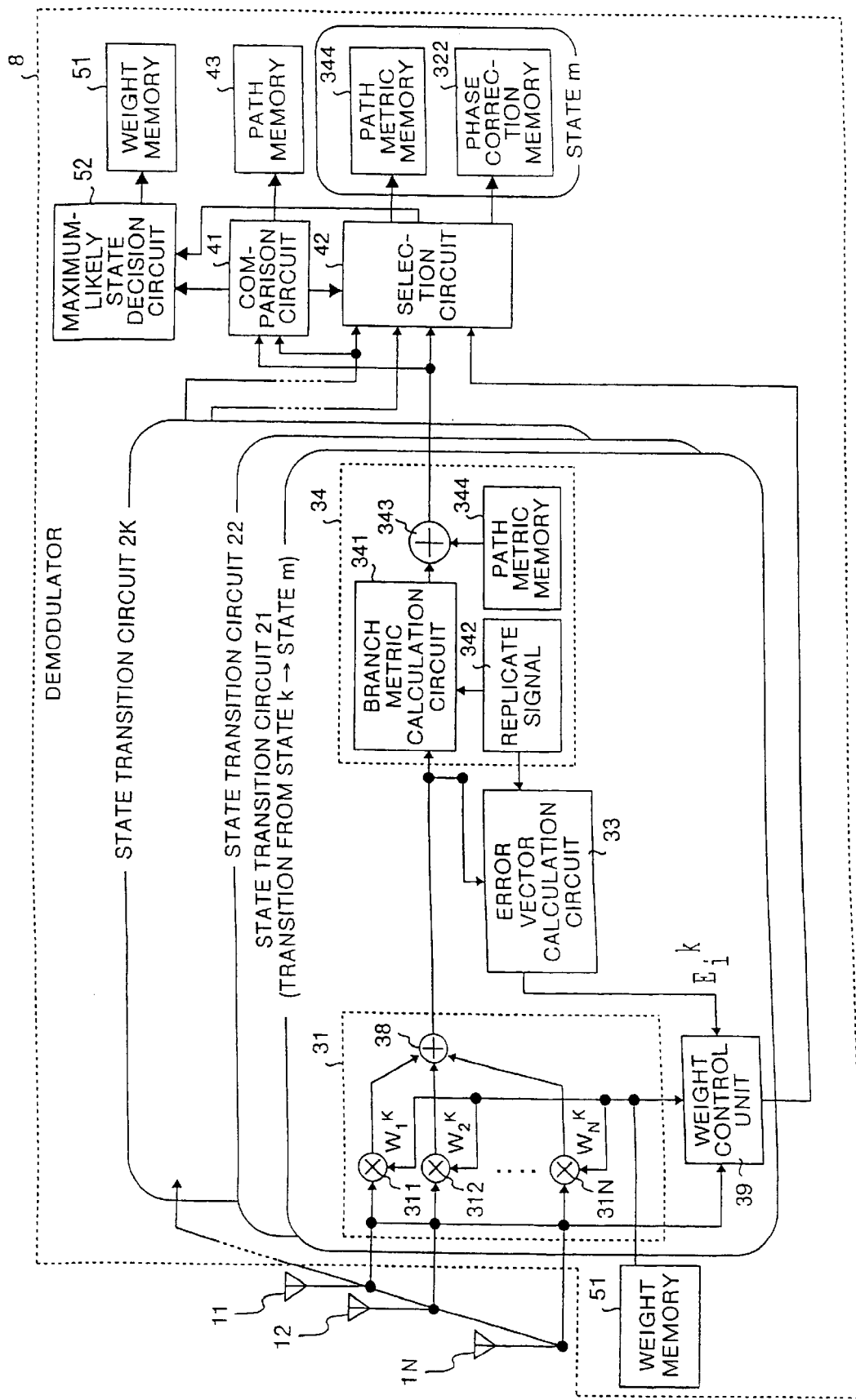
FIG. 12 is a diagram showing the configuration of a fourth embodiment of an adaptive array communication system according to the present invention.

FIG. 12 is a diagram showing the configuration of a fourth embodiment of an adaptive array communication system according to the present invention. This receiver comprises a demodulator 8 in place of the demodulator 3 in the first embodiment. The same reference numerals as in the first embodiment denote the same parts in FIG. 12, and a description thereof will be omitted.

In the first embodiment described above, complex weights are set for all state transitions, respectively, and the complex weights of the respective states are updated along a maximum-likely path to realize an adaptive array communication system. However, in this embodiment, complex weights are not necessarily set for all the state transitions. For example, based on a complex weight in the maximum-likely state at a specific symbol timing, a complex weight which shared by all the states at the next symbol timing may be updated. In this manner, only a complex weight in the maximum-likely state may be updated, and complex weights need not stored for respective states. Therefore, the circuit configuration can be simplified.

In FIG. 12, reference numeral 51 denotes a weight memory and reference numeral 52 denotes a maximum-likely state decision circuit. In the demodulator 8, received signals input from respective branches are input into an adaptive control unit 31. The multipliers perform weighting to the received signals by complex weights $w_{j,i}$ output from a weight memory 51 which is shared by all the states, and the combining unit 38 combines the outputs from the multipliers with each other.

An output from the combining unit 38 is output as a metric corresponding to a state transition by the decoding unit 34. The metric output from the decoding unit 34 is input into the comparison circuit 41. In this case, information related to a more likely state transition is output to the selection circuit 42.

In addition, the output from the combining unit 38 is input into the decoding unit 34 and also input into an error vector calculation circuit 33. In the error vector calculation circuit 33, the output is compared with a replicate signal serving as an ideal received signal to calculate an error vector $\epsilon_i^k$. Thereafter, the error vector $\epsilon_i^k$ output from the error vector calculation circuit 33 is input into the weight control unit 39. In the weight control unit 39, a candidate $w_{j,i+1}^{k \to m}$ of the complex weight at the next symbol timing is calculated. At this time, in the weight control unit 39, a candidate $w_{j,i+1}^{k \to m}$ of the complex weight is calculated by using the complex weights $w_{j,i}$ output from the weight memory 51 which is shared by all the states and Equation (10) described above. However, unlike the first embodiment, the value of a complex weight obtained before updating is not the value $w_{j,i}^k$ which varies depending on the states, and the same complex weight $w_{j,i}$ is used in all the states.

In the demodulator 8 of this embodiment, depending on a comparison result in the comparison circuit 41, a metric corresponding to a state transition which is decided to be reliable and a complex weight output from the weight control unit 39 are input into the maximum-likely state decision circuit 52. Here, a description is performed on the assumption that a metric $M_{i,i+1}^{k \to m}$ corresponding to a transition from a state k to a state m is larger than a metric corresponding to a transition from another state to the state m. More specifically, from the selection circuit 42, the metric $M_{i,i+1}^{k \to m}$ corresponding to the transition from the state k to the state m and the complex weight $w_{j,i+1}^{k \to m}$ are input into the maximum-likely state decision circuit 52.

Figure 13:
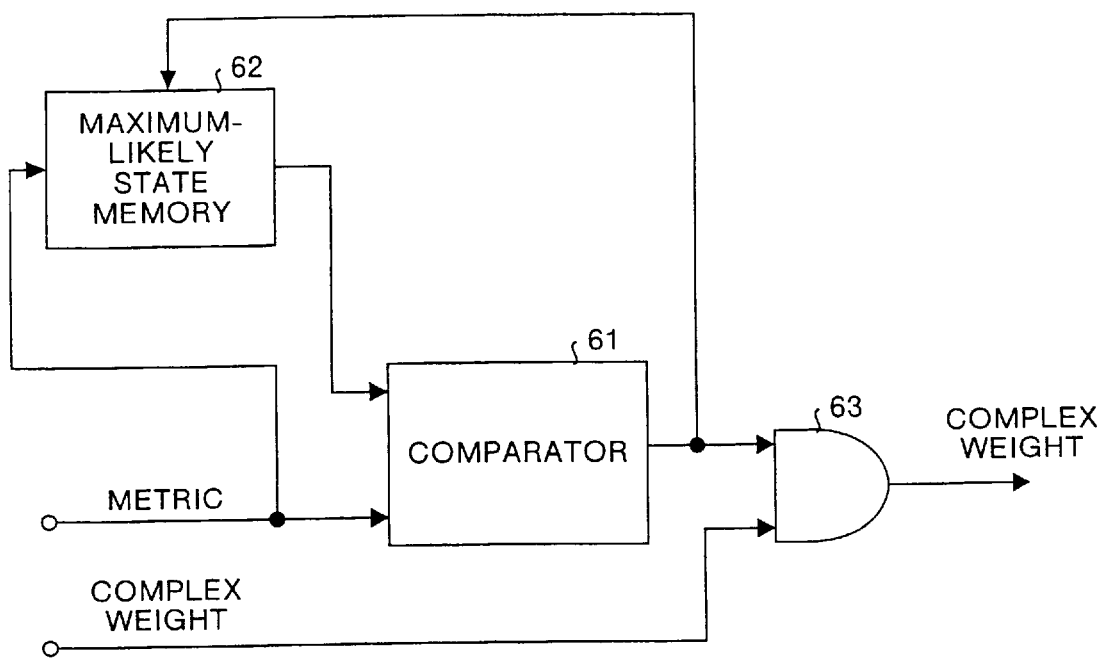
FIG. 13 is a diagram showing the configuration of a maximum-likely state decision circuit 52.
Figure 15:
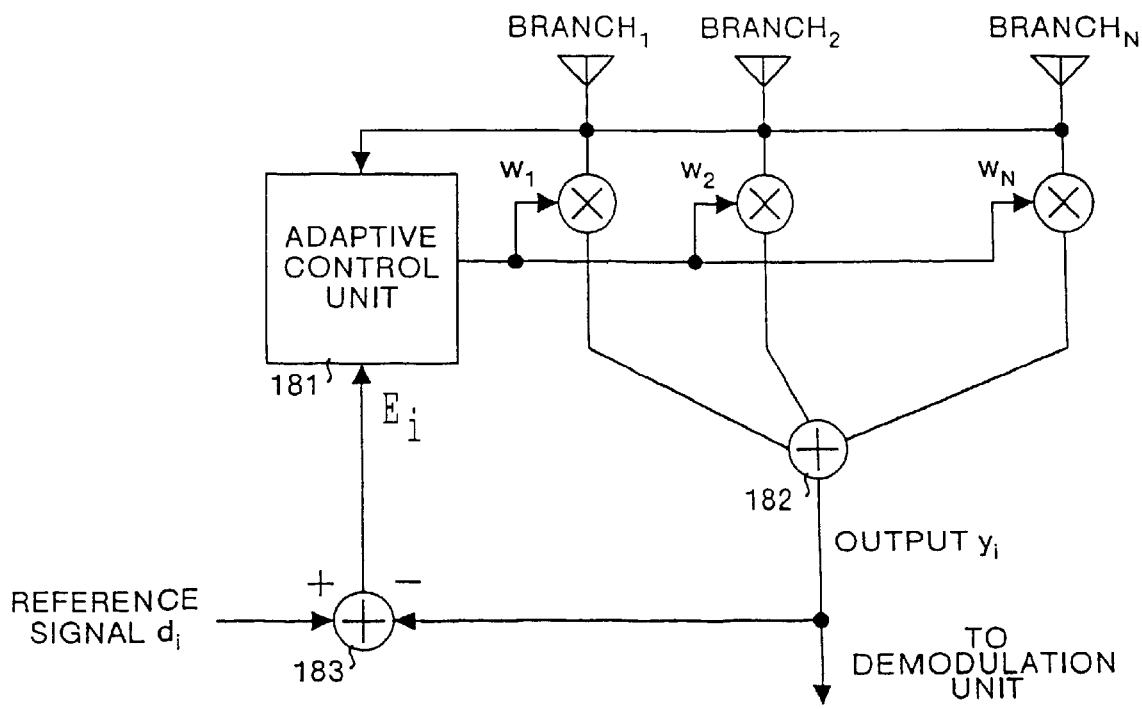
FIG. 15 is a diagram showing the configuration of a conventional receiver.
Figure 16:
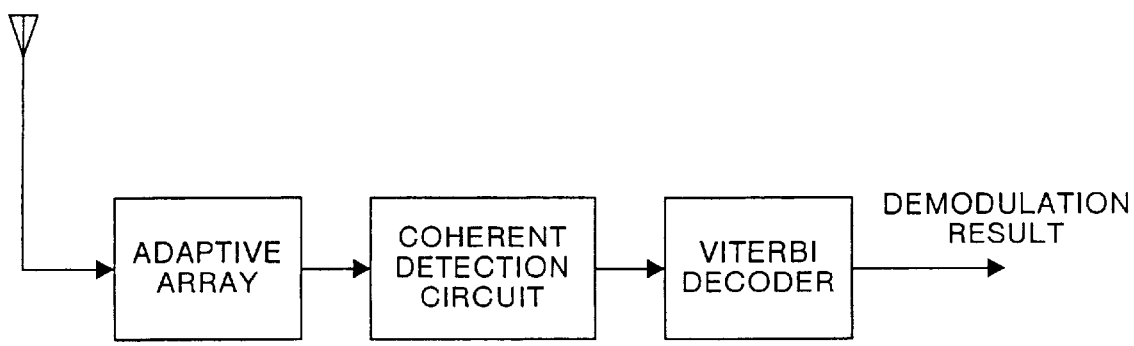
FIG. 16 is a diagram showing a configuration obtained when the adaptive array communication system shown in FIG. 15 is applied to a system using a viterbi decoding.
Figure 17:
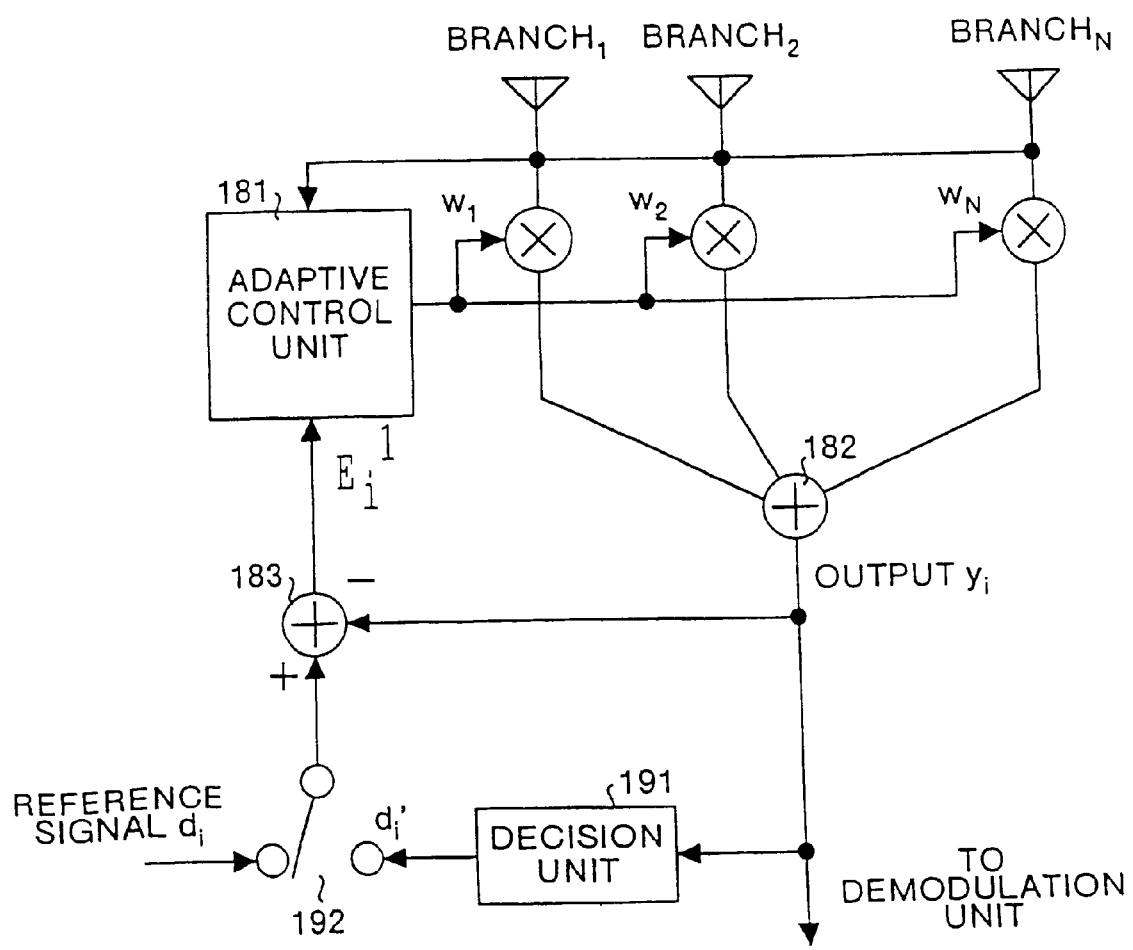
FIG. 17 is a diagram showing the configuration of a conventional receiver using a decision feedback loop.
Figure 18:
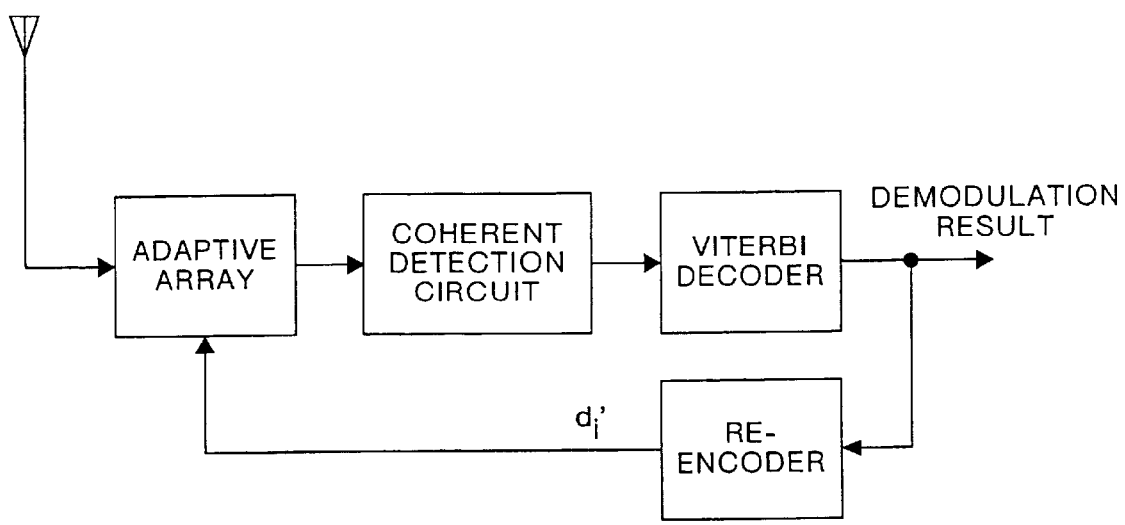
FIG. 18 is a configuration obtained when the adaptive array communication system using the decision feedback loop shown in FIG. 17 is applied to a system using viterbi decoding.

Operation of the maximum-likely state decision circuit 52 will be described below. FIG. 13 is a diagram showing the configuration of the maximum-likely state decision circuit 52. Reference numeral 61 denotes a comparator, reference numeral 62 denotes a maximum-likely state memory and reference numeral 63 denotes a logical AND circuit. For example, in the maximum-likely state decision circuit 52, when the metric $M_{i,i+1}{}^{k \to m}$ is input, the metric is received by the comparator 61 in the maximum-likely state decision circuit 52. In the comparator 61, the metric is compared with the metric in the maximum-likely state stored in the maximum-likely state memory 62. In this case, for example, when the metric corresponding to the transition from the state k to the state m is larger than the metric in the maximum-likely state stored in the maximum-likely state memory 62, i.e., when it is determined that the state transition from the state k to the state m is maximum-likely, the comparator 61 outputs 1 to the logical AND circuit 63. In this manner, the complex weights $w_{j,i+1}{}^{k \to m}$ corresponding to the transition from the state k to the state m is output from the maximum-likely state decision circuit 52 and input into the weight memory 51 at the next symbol timing. A complex weight stored in the weight memory 51 at present is updated into a complex weight in the maximum-likely state.

An output from the comparator 61 is also input into the maximum-likely state memory 62. When 1 is output from the comparator 61, the maximum-likely state memory 62 stores the input metric as a metric in a new maximum-likely state. More specifically, in this case, the metric $M_{i,i+1}{}^{k \to m}$ is stored in the maximum-likely state memory 62 as a metric in the maximum-likely state.

On the other hand, the metric in the maximum-likely state stored in the maximum-likely state memory 62 is larger than the metric corresponding to the transition from the state k to the state m, i.e., when it is determined that the state transition from the state k to the state m is not maximum-likely, the comparator 61 outputs 0 to the logical AND circuit 63. In this manner, the maximum-likely state decision circuit 52 is masked, nothing is output to the weight memory 51. More specifically, the complex weight in the maximum-likely state stored in the weight memory 51 is held.

An output from the comparator 61 is also input into the maximum-likely state memory 62. When 0 is output from the comparator 61, the maximum-likely state memory 62 does not store the input metric $M_{i,i+1}{}^{k \to m}$ in the maximum-likely state memory 62. More specifically, in this case, the metric in the maximum-likely state stored in the maximum-likely state memory 62 is held.

In this manner, in this embodiment, a complex weight stored in the weight memory 51 when calculations in all the state transitions are completed is used as a complex weight in the maximum-likely state at the present symbol timing.

In this embodiment, the same effect as that in the first embodiment can be obtained. The adaptive array communication system of the embodiment comprises the weight memory 51 which is shared by all the states and the maximum-likely state decision circuit 52 for updating the weight memory 51 depending on the cases, so that a complex weight in the maximum-likely state at a specific symbol timing can be updated as a complex weight shared by all states at the next timing. In addition, since complex weights need not be stored for respective states, a circuit scale can be considerably reduced.

In this embodiment, as an adaptive algorithm used in the weight control unit 39, for example, any one of an LMS algorithm which has a small calculation amount and requires relatively long time to converge a complex weight or an RLS algorithm which requires a calculation amount larger than that of the LMS algorithm but which can increase the convergent rate of a complex weight.

As has been described above, according to one aspect of this invention, the adaptive control unit which performs weight control for supplying optimum complex weights to respective states to maximize a weighted/combined desired wave component and to minimize an interference wave component is arranged, so that adaptive array control can be performed to each state of viterbi decoding. For this reason, even though a reference signal sequence length is short, an effect of being able to obtain an adaptive array communication system which can always calculate a correct complex weight is achieved. In addition, even though a complex weight varies with time in one burst period, the adaptive array communication system can easily follow the complex weight. For this reason, an effect of being able to obtain an adaptive array communication system which can realize a preferable demodulation characteristic is achieved.

According to the next aspect, for example, when a coding rate is increased to (n−1)/n by using a punctured code, an effect of being able to obtain an adaptive array communication system which can improve transmission efficiency is achieved. Furthermore, when a coding rate is set to be 1/n, an effect of being able to obtain an adaptive array communication system which can improve error correction capability is achieved.

According to the next aspect, by using the QPSK modulation method, an effect of being able to obtain an adaptive array communication system which can obtain a preferable characteristic in a severe environment is achieved. By using the BPSK modulation method, an effect of being able to obtain an adaptive array communication system which can simplify mapping is achieved.

According to the next aspect, based on a complex weight in the maximum-likely state at a specific symbol timing, a complex weight shared by all states at the next symbol timing can be updated. In addition, since complex weights need not be stored for respective states, an effect of being able to obtain an adaptive array communication system which can considerably reduce a circuit scale is achieved.

According to the next aspect, when as an adaptive algorithm, for example, the LMS algorithm is applied, an effect of being able to obtain an adaptive array communication system which can reduce a calculation amount is achieved. On the other hand, when the RLS algorithm is applied, an effect of being able to obtain an adaptive array communication system which requires a calculation amount larger than that of the LMS algorithm but can increase a convergent rate of a complex weight is achieved.

According to the next aspect, the adaptive control unit which performs weight control for supplying optimum complex weights to respective states to maximize a weighted/combined desired wave component and to minimize an interference wave component is arranged, so that adaptive array control can be performed to each state of viterbi decoding. For this reason, even though a reference signal sequence length is short, an effect of being able to obtain a receiver which can always calculate a correct complex weight is achieved. In addition, even though a complex weight varies with time in one burst period, the receiver can easily follow the complex weight. For this reason, an effect of being able to obtain a receiver which can realize a preferable demodulation characteristic is achieved.

According to the next aspect, based on a complex weight in the maximum-likely state at a specific symbol timing, as a complex weight shared by all states at the next symbol a complex weight shared by all states at the next symbol timing may be updated. In addition, since complex weights need not be stored for respective states, an effect of being able to obtain a receiver which can considerably reduce a circuit scale is achieved.

According to the next aspect, when as an adaptive algorithm, for example, the LMS algorithm is applied, an effect of being able to obtain a receiver which can reduce a calculation amount is achieved. On the other hand, when the RLS algorithm is applied, an effect of being able to obtain a receiver which requires a calculation amount larger than that of the LMS algorithm but can increase a convergent rate of a complex weight is achieved.

Industrial Applicability

As has been described above, an adaptive array communication system and a receiver according to the present invention are useful for a communication environment which easily affected by fading like mobile communication or the like. More particular, the adaptive array communication system and the receiver are suitable as communication devices which perform data communication and audio communication in a communication environment in which a reception power varies due to movement or fading, and a complex weight varies with time.

What is claimed is:

1. An adaptive array communication system comprising a transmitter which modulates coded information data by a predetermined modulation method, and a receiver which performs known viterbi decoding to a received signal from the transmitter to select a most likely path, wherein the receiver includes, for each state of the viterbi decoding, an adaptive control unit which performs weight control on the basis of a known adaptive algorithm, multiplies received signals from a plurality of antennas by complex weights which are different from each other for the respective states to perform weighting processes depending on the received signals, and, thereafter, combines the weighted signals to perform such control that a desired wave component is maximized and an interference wave component is minimized;

a decoding unit which adds a branch metric calculated by a difference between a signal obtained after the weighting combining and a reference signal (replicate signal) serving as an ideal received signal and a path metric to calculate a metric corresponding to a transition to a desired state; and an error vector calculation unit which calculates an error vector for calculating complex weights which are different from each other for the respective states on the basis of the signal obtained after the weighting combining and the reference signal, and wherein the directivities of the plurality of antennas are adaptively controlled to perform a process of removing an interference wave except for a desired wave and a process of combining a plurality of desired waves.

2. The adaptive array communication system according to claim 1, wherein the transmitter makes a coding rate in convolutional coding variable.

3. The adaptive array communication system according to claim 1, wherein the predetermined modulation method in the transmitter is BPSK or QPSK.

4. The adaptive array communication system according to claim 1, wherein the kown adaptive algorithm is LMS algorithm or RLS algorithm.

5. An adaptive array communication system comprising a transmitter which modulates coded information data by a predetermined modulation method, and a receiver which performs known viterbi decoding to a received signal from the transmitter to select a most likely path, wherein the receiver includes, for each state of the viterbi decoding, an adaptive control unit which performs weight performs weight control on the basis of a known adaptive algorithm, multiplies received signals from a plurality of antennas by a complex weight shared by all the states to perform weighting processes depending on the received signals, and, thereafter, combines the weighted signals to perform such control that a desired wave component is maximized and an interference wave component is minimized;

a decoding unit which adds a branch metric and a path metric calculated by a difference between a signal obtained after the weighting combining and a reference signal (replicate signal) serving as an ideal received signal to calculate a metric corresponding to a transition to a desired state; and a vector calculation unit which calculates an error vector for calculating a complex weight which is shared by all states on the basis of the signal obtained after the weighting combining and the reference signal, and the receiver further comprises a maximum-likely state decision unit which decides a candidate of complex weight in a maximum-likely state at a specific symbol timing as a complex weight shared by all states at the next symbol timing for each receiver, and wherein the directivities of the plurality of antennas are adaptively controlled to perform a removing process of an inerference wave except for a desired wave or a combining process of a plurality of desired waves.

6. The adaptive array communication system according to claim 5, wherein the known adaptive algorithm is LMS algorithm or RLS algorithm.

7. A receiver which performs known viterbi decoding to a signal from a transmitter which modulates coded information data by a predetermined modulation method, the receiver comprising:

for each state of viterbi decoding, an adaptive control unit which performs weight control on the basis of a known adaptive algorithm, multiplies received signals from a plurality of antennas by complex weights which are different from each other for the respective states to perform weighting processes depending on the received signals, and, thereafter, combines the weighted signals to perform such control that a desired wave component is maximized and an interference wave component is minimized;

a decoding unit which adds a branch metric and a path metric calculated by a difference between a signal obtained after the weighting combining and a reference signal (replicate signal) serving as an ideal received signal to calculate a metric corresponding to a transition to a desired state; and an error vector calculation unit which calculates an error vector for calculating complex weights which are different from each other for the respective states on the basis of the signal obtained after the weighting combining and the reference signal.

8. The receiver according to claim 7, wherein the known adaptive algorithm is LMS algorithm or RLS algorithm.

9. A receiver which performs known viterbi decoding to a signal from a transmitter for demodulating coded information data by a predetermined modulation method, receiver comprising:

for each state of viterbi decoding, an adaptive control unit which performs weight control on the basis of a known adaptive algorithm, multiplies received signals from a plurality of antennas by a complex weight shared by all states to perform weighting processes depending on the received signals, and, thereafter, combines the weighted signals to perform such control that a desired wave component is maximized and an interference wave component is minimized;

a decoding unit which adds a branch metric and a branch metric and a path metric calculated by a difference between a signal obtained after the weighting combining and a reference signal (replicate signal) serving as an ideal received signal to calculate a metric corresponding to a transition to a desired state; and an error vector calculation unit which calculates an error vector for calculating a complex weight which is shared by all the states on the basis of the signal obtained after the weighting combining and the reference signal, and the receiver further comprises a maximum-likely state decision unit which decides a candidate of complex weight in a maximum-likely state at a specific symbol timing as a complex weight shared by all states at the next symbol timing.

10. The receiver according to claim 9, wherein the known adaptive algorithm is LMS algorithm or RLS algorithm.

* * * * *